United States Patent
Okumura et al.

(10) Patent No.: US 10,236,372 B2
(45) Date of Patent: Mar. 19, 2019

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Keiji Okumura, Matsumoto (JP); Setsuko Wakimoto, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 3 days.

(21) Appl. No.: 15/629,874

(22) Filed: Jun. 22, 2017

(65) Prior Publication Data
US 2018/0033885 A1 Feb. 1, 2018

(30) Foreign Application Priority Data
Jul. 29, 2016 (JP) ................................. 2016-150848

(51) Int. Cl.
*H01L 29/78* (2006.01)
*H01L 29/66* (2006.01)
(Continued)

(52) U.S. Cl.
CPC .... *H01L 29/7813* (2013.01); *H01L 21/02378* (2013.01); *H01L 21/02529* (2013.01);
(Continued)

(58) Field of Classification Search
CPC ............. H01L 29/1608; H01L 29/7813; H01L 29/66734; H01L 29/1095; H01L 29/4236;
(Continued)

(56) References Cited

U.S. PATENT DOCUMENTS

| 8,283,721 B2 * | 10/2012 | Nakano ............... H01L 29/0623 257/330 |
| 2007/0194375 A1 * | 8/2007 | Kawaguchi ......... H01L 29/0634 257/330 |

(Continued)

FOREIGN PATENT DOCUMENTS

| JP | 2012-99601 A | 5/2012 |
| JP | 2015-72999 A | 4/2015 |

*Primary Examiner* — Jonathan Han

(57) ABSTRACT

A silicon carbide semiconductor device, including a silicon carbide substrate, multiple trenches provided in the silicon carbide substrate, a first semiconductor region provided between each adjacent two of the trenches, a second semiconductor region selectively provided in the first semiconductor region, multiple third semiconductor regions selectively provided in the silicon carbide substrate to each cover a bottom of one trench, multiple fourth semiconductor regions selectively provided in the silicon carbide substrate, each between adjacent two of the trenches and being in contact with the first semiconductor region, multiple gate electrodes, each provided via a gate insulating film in one of the trenches, a first electrode connected to the first and second semiconductor regions, and a second electrode connected to the rear surface of the silicon carbide substrate. At least two of the trenches are arranged between each adjacent two of the fourth semiconductor regions.

8 Claims, 22 Drawing Sheets

(51) Int. Cl.
*H01L 29/06* (2006.01)
*H01L 21/02* (2006.01)
*H01L 21/04* (2006.01)
*H01L 21/3213* (2006.01)
*H01L 29/08* (2006.01)
*H01L 29/16* (2006.01)
*H01L 29/417* (2006.01)
*H01L 29/423* (2006.01)
*H01L 29/49* (2006.01)
*H01L 29/10* (2006.01)
*H01L 29/739* (2006.01)

(52) U.S. Cl.
CPC ...... *H01L 21/02634* (2013.01); *H01L 21/049* (2013.01); *H01L 21/32133* (2013.01); *H01L 29/0684* (2013.01); *H01L 29/0696* (2013.01); *H01L 29/0865* (2013.01); *H01L 29/0882* (2013.01); *H01L 29/1608* (2013.01); *H01L 29/41741* (2013.01); *H01L 29/4236* (2013.01); *H01L 29/4916* (2013.01); *H01L 29/66068* (2013.01); *H01L 29/66734* (2013.01); *H01L 29/66348* (2013.01); *H01L 29/7397* (2013.01)

(58) Field of Classification Search
CPC ........... H01L 29/66068; H01L 29/7397; H01L 21/02529; H01L 21/02378
USPC .............................. 257/77, E21.41; 438/270
See application file for complete search history.

(56) References Cited

U.S. PATENT DOCUMENTS

| 2012/0280255 A1* | 11/2012 | Masuda | H01L 29/1095 257/77 |
| 2013/0306983 A1* | 11/2013 | Nakano | H01L 29/0623 257/76 |
| 2016/0247910 A1* | 8/2016 | Suzuki | H01L 29/66068 |

\* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2016-150848, filed on Jul. 29, 2016, the entire contents of which are incorporated herein by reference.

BACKGROUND OF THE INVENTION

1. Field of the Invention

Embodiments of the present invention relate to a silicon carbide semiconductor device and a method of manufacturing a silicon carbide semiconductor device.

2. Description of the Related Art

Silicon carbide (SiC) is expected to replace silicon (Si) as a next generation semiconductor material. Compared to a conventional semiconductor element that uses silicon, a semiconductor element that uses silicon carbide (hereinafter, silicon carbide semiconductor device) has various advantages such as lowering the resistance of the device in the ON state to several hundredths of that of a conventional semiconductor element and use in environments of higher temperatures (200 degrees C. or higher). These differences are consequent to characteristics of the material itself. For example, silicon carbide has a bandgap that is about 3 times larger than that of silicon and a dielectric breakdown field strength that is nearly 10 times higher than that of silicon.

Currently, such silicon carbide semiconductor devices that have become commercial products include Schottky barrier diodes (SBDs), vertical metal oxide semiconductor field effect transistors (MOSFETs) of a planar gate structure, and vertical MOSFETs (e.g., trench gate SiC-MOSFETs) of a trench gate structure.

A trench gate structure is a 3-dimensional structure in which a MOS gate is embedded in a trench formed in a semiconductor base containing silicon carbide (hereinafter, the silicon carbide base). In a trench gate structure, a portion along a sidewall of the trench is used as a channel (inversion layer). Therefore, when elements of the same ON resistance (RonA) are compared, that having a trench gate structure may have a smaller element area (chip area) than that of a planar gate structure having a MOS gate provided in a flat state on a silicon carbide base and therefore, the former may be said to be a promising gate structure.

However, as described above, silicon carbide has a dielectric breakdown field strength that is nearly 10 times greater than that of silicon and therefore, in a trench gate SiC-MOSFET, compared to a trench gate MOSFET using silicon, the bottom of the trench is subject to a larger electric field whereby the breakdown voltage at the bottom of the trench decreases. The breakdown voltage is the voltage limit that does not cause element breakdown. Since the breakdown voltage of the element overall is a rate-limiting factor of the breakdown voltage at the trench bottom, to secure a predetermined breakdown voltage, a cell structure (unit structure) for mitigating the electric field at the trench bottom has been proposed.

As a trench gate SiC-MOSFET that secures a predetermined breakdown voltage, a device has been proposed that includes a $p^+$-type region that contacts the entire region of the bottom of the trench and extends to a position so as to contact a portion of the sidewall of the trench (for example, refer to Japanese Laid-Open Patent Publication No. 2012-099601 (paragraph 0021, FIG. 1)).

Another trench gate SiC-MOSFET has been proposed that includes between trenches (at a mesa portion), a $p^+$-type region that reaches an $n^-$-type drift region from a boundary of a p-type base region and an n-type current spreading layer (for example, refer to Japanese Laid-Open Patent Publication No. 2015-072999 (paragraphs 0023 to 0024, FIG. 9)).

A structure of a conventional trench gate SiC-MOSFET will be described. FIG. 20 is a cross-sectional view of a structure of a conventional trench gate SiC-MOSFET. FIG. 20 depicts a cross-section of two adjacent cells (element constituent units). The conventional trench gate SiC-MOSFET depicted in FIG. 20 includes a MOS gate of an ordinary trench gate structure on a front surface (surface on a p-type base region 104 side) side of a semiconductor base 110 containing silicon carbide (hereinafter, silicon carbide base 110).

The silicon carbide base 110 is formed by sequentially forming by epitaxial growth on an $n^+$-type supporting substrate 101 containing silicon carbide (hereinafter, the $n^+$-type silicon carbide substrate), an $n^-$-type drift region 102, an n-type region 103, and the p-type base region 104. The n-type region 103 is a so-called current spreading layer (CSL). In the n-type region 103, a first $p^+$-type region 111 is selectively provided so as to cover the entire bottom of a trench 107.

Further, in the n-type region 103, between adjacent trenches 107 (in a mesa portion), a second $p^+$-type region 112 is selectively provided. The first and second $p^+$-type regions 111, 112 have a function of mitigating the electric field applied to the bottom of the trench 107. Reference numerals 105, 106, 108, 109, 114 to 117 are an $n^+$-type source region, a $p^{++}$-type contact region, a gate insulating film, a gate electrode, an interlayer insulating film, a barrier metal, a source electrode, and a drain electrode, respectively.

FIGS. 21 and 22 are plan views of a planar layout of the conventional trench gate SiC-MOSFET. The structure at cutting line AA-AA' in FIG. 21 and the structure at cutting line BB-BB' in FIG. 22 correspond to FIG. 20. FIG. 21 depicts a planar layout of the trench 107 and the $p^{++}$-type contact region 106. FIG. 22 depicts a planar layout of the first and second $p^+$-type regions 111, 112 (hatched portions) and a JFET region 113 (white portions).

As depicted in FIG. 21, the $p^{++}$-type contact region 106 and the trench 107 are arranged in a striped planar layout, extending along a predetermined direction (hereinafter, first direction) X and are repeatedly arranged alternating along a direction (hereinafter, second direction) Y orthogonal to the first direction X. Two adjacent trenches 107 each have an end portion 107a that are continuous with one another to have substantially a ring-shaped planar layout. A connection portion 107b of the trench 107 is connected to a gate runner 119.

As depicted in FIG. 22, the first and second $p^+$-type regions 111, 112 and the JFET region 113 are arranged in a striped planar layout extending along the first direction X. Every other second $p^+$-type region 112 along the second direction Y is encompassed by the trenches 107 in the substantially ring-shaped planar layout. Every other pair of the JFET regions 113 along the second direction Y is encompassed by the trenches 107 in the substantially ring-shaped planar layout.

In the conventional trench gate SiC-MOSFET depicted in FIGS. 20 to 22, cell pitch (the width of a single cell) w104 is determined by the sum of a width w101 of the first $p^+$-type region 111, (half of a width w102 of the second $p^+$-type region 112)×2, and a width w103×2 of a region between the first and second $p^+$-type regions 111, 112 (hereinafter, junction FET (JFET) region 113). The minimum values of the respective widths w101 to w103 of the first and second $p^+$-type regions 111, 112 and the JFET region 113 are determined by process limits (for example, process limits of etching) of the semiconductor manufacturing equipment.

In particular, the minimum value of the width w101 of the first $p^+$-type region 111 is 1.5 μm and the minimum value of the width w102 of the second $p^+$-type region 112 is 1.0 μm. FIG. 20 depicts the second $p^+$-type region 112 for one cell (i.e., half of the second $p^+$-type region 112). The minimum value of the width w103 of the JFET region 113 is 1.0 μm. Therefore, when the cell structure of the conventional trench gate SiC-MOSFET depicted in FIG. 20 is adopted, the minimum value of the cell pitch w104 is 4.5 μm (=1.5 μm+(1.0 μm×½)×2+1.0 μm×2).

SUMMARY OF THE INVENTION

According to one aspect of the present invention, a silicon carbide semiconductor device includes plural trenches provided in a silicon carbide substrate of a first conductivity type, the plural trenches provided to a predetermined depth from a front surface of the silicon carbide substrate; a first semiconductor region of a second conductivity type, provided between adjacent trenches of the plural trenches; a second semiconductor region of the first conductivity type, selectively provided in the first semiconductor region; a third semiconductor region of the second conductivity type, selectively provided in the silicon carbide substrate to cover a bottom of a trench of the plural trenches; a fourth semiconductor region of the second conductivity type, selectively provided in the silicon carbide substrate to be in contact with the first semiconductor region between the plural trenches and adjacent plural trenches; a gate electrode provided on a gate insulating film in the trench of the plural trenches; a unit structure arranged in plural at a predetermined pitch, each having an insulated gate structure constituted by the gate electrode in one trench of the plural trenches; a first electrode connected to the first semiconductor region and the second semiconductor region; and a second electrode connected to a rear surface of the silicon carbide substrate. Between the fourth semiconductor region and an adjacent fourth semiconductor region, two or more trenches of the plural trenches are arranged.

In the silicon carbide semiconductor device, the fourth semiconductor region is provided separately from the third semiconductor region.

In the silicon carbide semiconductor device, the fourth semiconductor region is partially connected to the third semiconductor region adjacent thereto.

In the silicon carbide semiconductor device, between the fourth semiconductor region and the adjacent fourth semiconductor region, three or more trenches of the plural trenches are arranged, and the third semiconductor region and an adjacent third semiconductor region are partially connected.

In the silicon carbide semiconductor device, the plural trenches are arranged in a striped layout extending along a direction parallel to the front surface of the silicon carbide substrate.

The silicon carbide semiconductor device includes a fifth semiconductor region of the second conductivity type, selectively provided in first semiconductor region; and a sixth semiconductor region of the second conductivity type, selectively provided in the first semiconductor region. The fifth semiconductor region is arranged at a position to face the fourth semiconductor region in a depth direction. The sixth semiconductor region is arranged near end portions of two or more trenches of the plural trenches arranged between the fourth semiconductor region and the adjacent fourth semiconductor region. The first electrode is connected to the first semiconductor region through the fifth semiconductor region and the sixth semiconductor region.

In the silicon carbide semiconductor device, the predetermined pitch is 4 μm or less.

According to another aspect of the present invention, a method of manufacturing a silicon carbide semiconductor device having plural unit structures each having one insulated gate structure constituted by a trench provided in a silicon substrate of a first conductivity type, at a predetermined depth from a front surface of the silicon carbide substrate and a gate electrode provided on a gate insulating film in the trench, includes forming the trench in plural at the predetermined depth from the front surface of the silicon carbide substrate; forming the gate insulating film along an inner wall of the trench; forming a poly-silicon layer on a surface of the gate insulating film and the front surface of the silicon carbide substrate so as to be embedded in the trench; etching back the poly-silicon layer until the gate insulating film is exposed, leaving the poly-silicon layer to become the gate electrode in the trench and thereby form the plural unit structures each having the insulated gate structure.

In the method, the insulated gate structure includes: a first semiconductor region of a second conductivity type, provided between adjacent trenches of the plural trenches, and a second semiconductor region of the first conductivity type, selectively provided in the first semiconductor region. The method includes before the plural trenches are formed: depositing a first silicon carbide layer of the first conductivity type, on a front surface of a starting substrate containing silicon carbide; selectively forming a third semiconductor region of the second conductivity type, in the first silicon carbide layer; selectively forming a fourth semiconductor region of the second conductivity type, in the first silicon carbide layer so as to be exposed at a surface of the first silicon carbide layer; depositing a second silicon carbide layer of the second conductivity type so as to cover the third semiconductor region and the fourth semiconductor region, the second silicon carbide layer becoming the first semiconductor region, and forming the silicon carbide substrate obtained by sequentially depositing the starting substrate, the first silicon carbide layer, and the second silicon carbide layer; and selectively forming the second semiconductor region in the second silicon carbide layer. The plural trenches are formed to penetrate the second semiconductor region and the second silicon carbide layer, and reach the third semiconductor region.

The method includes after etching back the poly-silicon: forming a first electrode connected to the second semiconductor region and the second silicon carbide layer; and forming a second electrode connected to a rear surface of the silicon carbide substrate.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
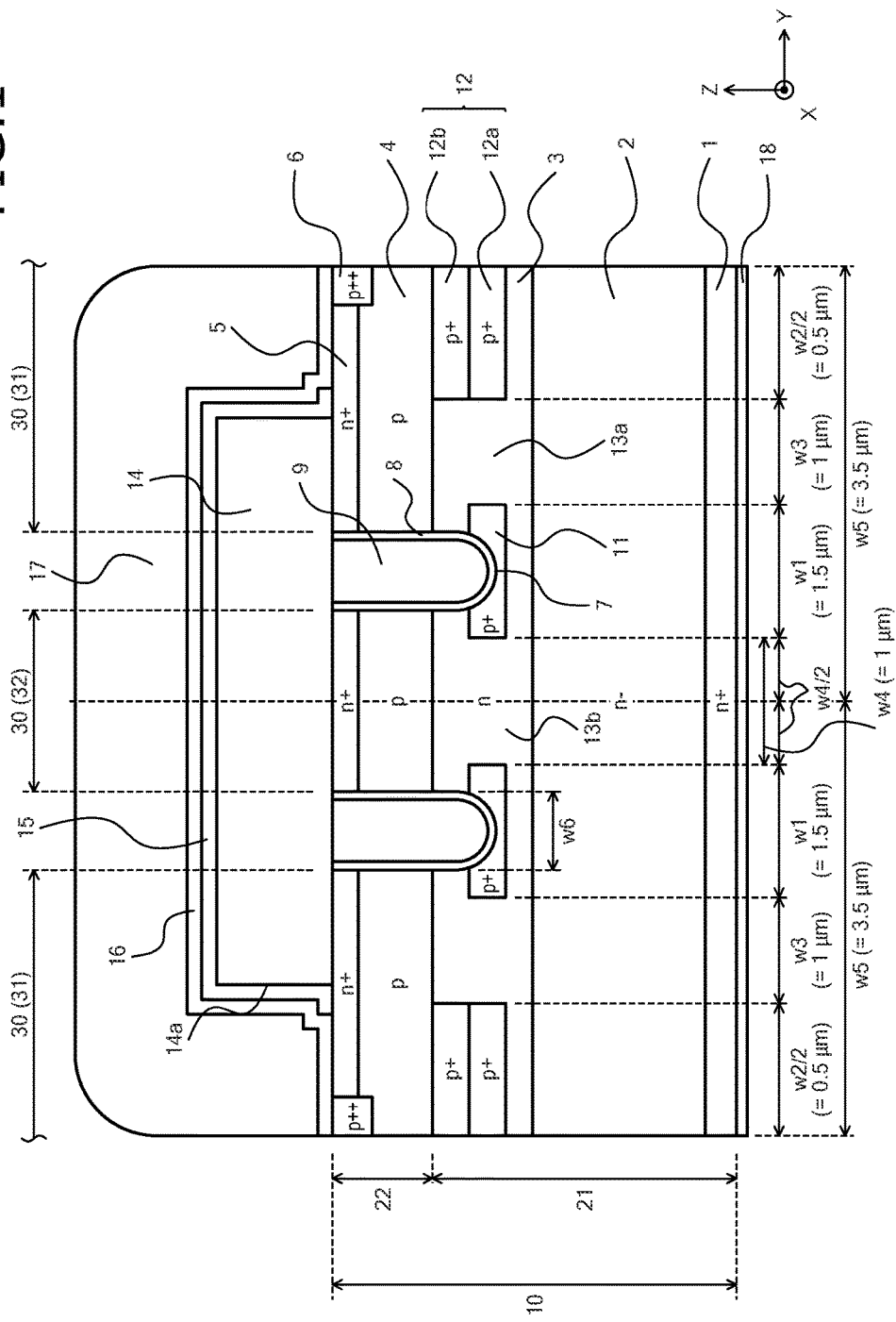
FIG. 1 is a cross-sectional view of a structure of a silicon carbide semiconductor device according to a first embodiment.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. Depending on the structure that is optimal, the concentrations may be reversed. In the description of the embodiments below and the accompanying drawings, main portions that are identical will be given the same reference numerals and will not be repeatedly described.

A structure of the silicon carbide semiconductor device according to a first embodiment will be described. FIG. 1 is a cross-sectional view of the structure of the silicon carbide semiconductor device according to the first embodiment. In FIG. 1, although two adjacent cells (constituent units of the element) among plural cells arranged in an active region 41 are depicted, all of the cells have the same structure (unit structure) (similarly in FIGS. 3 to 7). The silicon carbide semiconductor device according to the first embodiment depicted in FIG. 1 is a trench gate SiC-MOSFET having a MOS gate of a trench gate structure on a front surface (the surface of a p-type base region 4 side) side of a semiconductor base (silicon carbide base of a semiconductor chip) 10 containing silicon carbide.

The silicon carbide base 10 is formed by sequentially forming by epitaxial growth on an $n^+$-type supporting substrate ($n^+$-type silicon carbide substrate) 1 containing silicon carbide, silicon carbide layers (first and second silicon carbide layers) 21, 22 becoming an $n^-$-type drift region 2 and a p-type base region (first semiconductor region) 4. The MOS gate is constituted by the p-type base region 4, an $n^+$-type source region (second semiconductor region) 5, a $p^{++}$-type contact region (fifth semiconductor region) 6, a trench 7, a gate insulating film 8, and a gate electrode 9. In particular, at a surface layer on a source side (a source electrode 16 side) of the $n^-$-type silicon carbide layer 21 becoming the $n^-$-type drift region 2, an n-type region (i.e., n-type CSL region) 3 is provided so as to contact the p-type base region 4.

A portion of the $n^-$-type silicon carbide layer 21 excluding the n-type CSL region 3 is the $n^-$-type drift region 2. The n-type CSL region 3 is a so-called current spreading layer (CSL) that reduces the carrier spreading resistance. The n-type CSL region 3, for example, is provided uniformly along a direction (that is, the horizontal direction) parallel to a base front surface (the front surface of the silicon carbide base 10). The n-type CSL region 3 may be an n-type silicon carbide layer formed by epitaxial growth on the $n^-$-type silicon carbide layer 21 that becomes the $n^-$-type drift region 2. In the n-type CSL region 3, first and second $p^+$-type regions (third and fourth semiconductor regions) 11, 12 are each selectively provided.

The first $p^+$-type region 11 is provided so as to cover a bottom and a bottom-corner portion of the trench 7. The bottom-corner portion of the trench 7 is a boundary of the bottom and a sidewall of the trench 7. The first $p^+$-type region 11 is provided from a deep position farther on a drain side than an interface of the p-type base region 4 and the n-type CSL region 3 is, to a depth not reaching an interface of the n-type CSL region 3 and the $n^-$-type drift region 2. Provision of the first $p^+$-type region 11 enables formation of a pn junction between the first $p^+$-type region 11 and the n-type CSL region 3, near the bottom of the trench 7. Therefore, high electric field at a portion of the gate insulating film 8 along the bottom of the trench 7 may be suppressed.

The second $p^+$-type region 12 (12a, 12b) provided between adjacent trenches 7 (mesa portion) 30(31) so as to be separate from the first $p^+$-type region 11 and contact the p-type base region 4. Further, the second $p^+$-type region 12 is provided from the interface of the p-type base region 4 and the n-type CSL region 3, to a depth not reaching the interface of the n-type CSL region 3 and the $n^-$-type drift region 2. Provision of the second $p^+$-type region 12 enables formation of a pn junction between the second $p^+$-type region 12 and the n-type CSL region 3, in the mesa portion 30(31) at a deep position farther on the drain side than the bottom of the trench 7 is. As a result, high electric field at a portion of the gate insulating film 8 along the bottom of the trench 7 may be suppressed.

Further, the second p$^+$-type region 12 is removed in certain intervals whereby a mesa portion (hereinafter, first mesa portion) 31 in which the second p$^+$-type region 12 is disposed and a mesa portion (hereinafter, second mesa portion) 32 in which the second p$^+$-type region 12 is not disposed are present. Removal of the second p$^+$-type region 12 is the provision of the mesa portion 30 (32) in which the second p$^+$-type region 12 is not provided. In other words, between adjacent second p$^+$-type regions 12 facing each other along the second direction Y, are at least two trenches 7. FIG. 1 depicts a case in which two trenches are between adjacent second p$^+$-type regions 12 facing each other along the second direction Y (removal count=1). The second p$^+$-type region 12 functions as a p-type base region.

Figure 20:
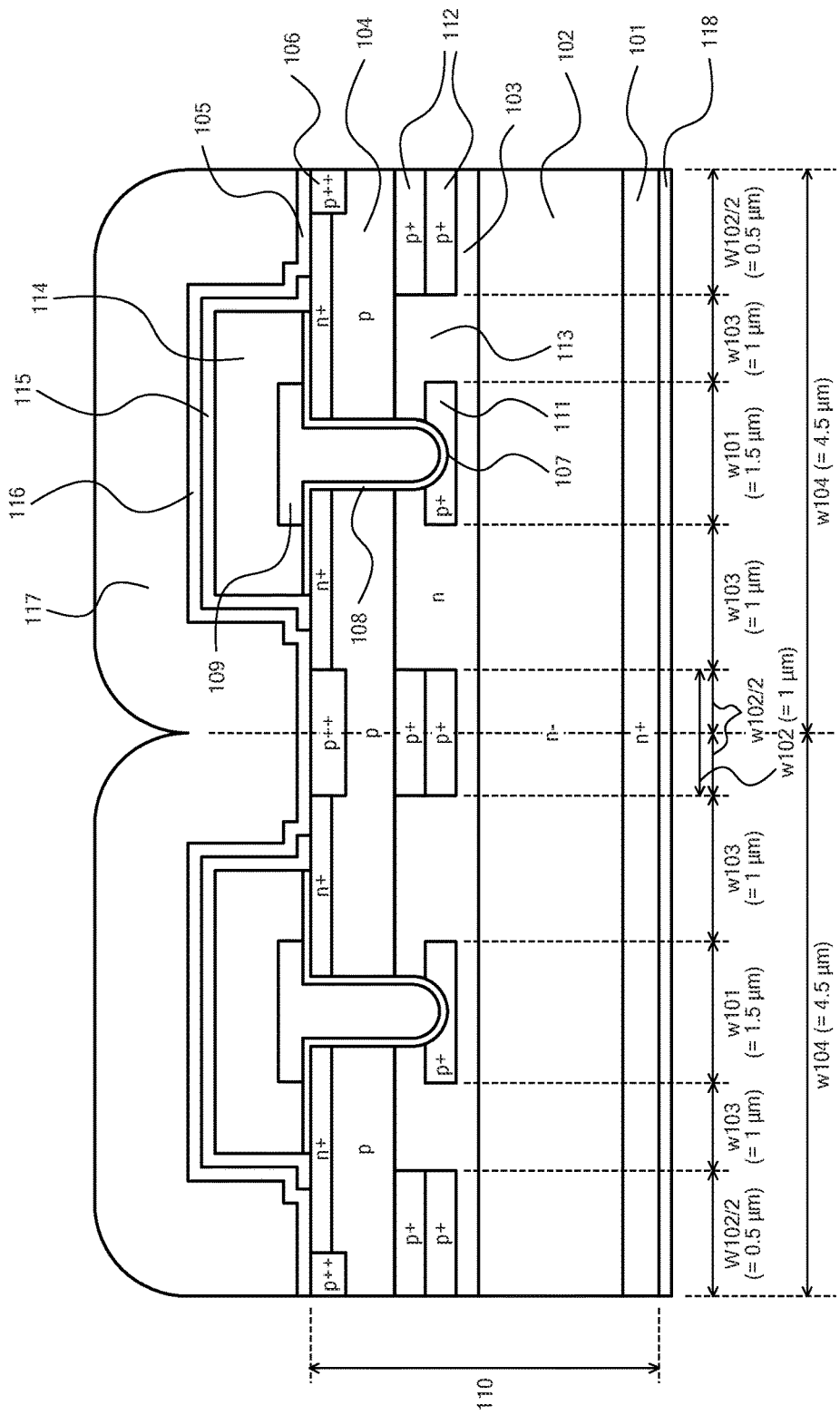
FIG. 20 is a cross-sectional view of a structure of a conventional trench gate SiC-MOSFET.
Figure 21:
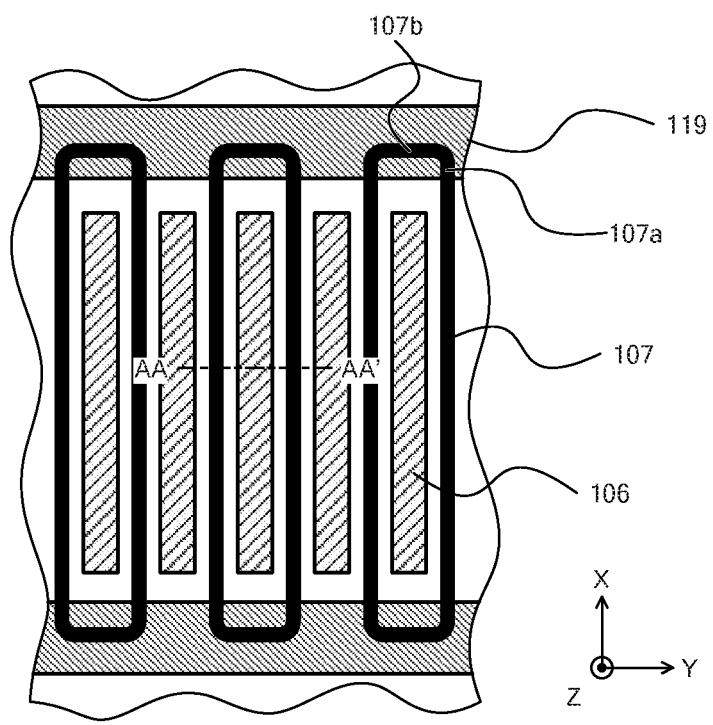
FIGS. 21 and 22 are plan views of a planar layout of the conventional trench gate SiC-MOSFET.
Figure 22:
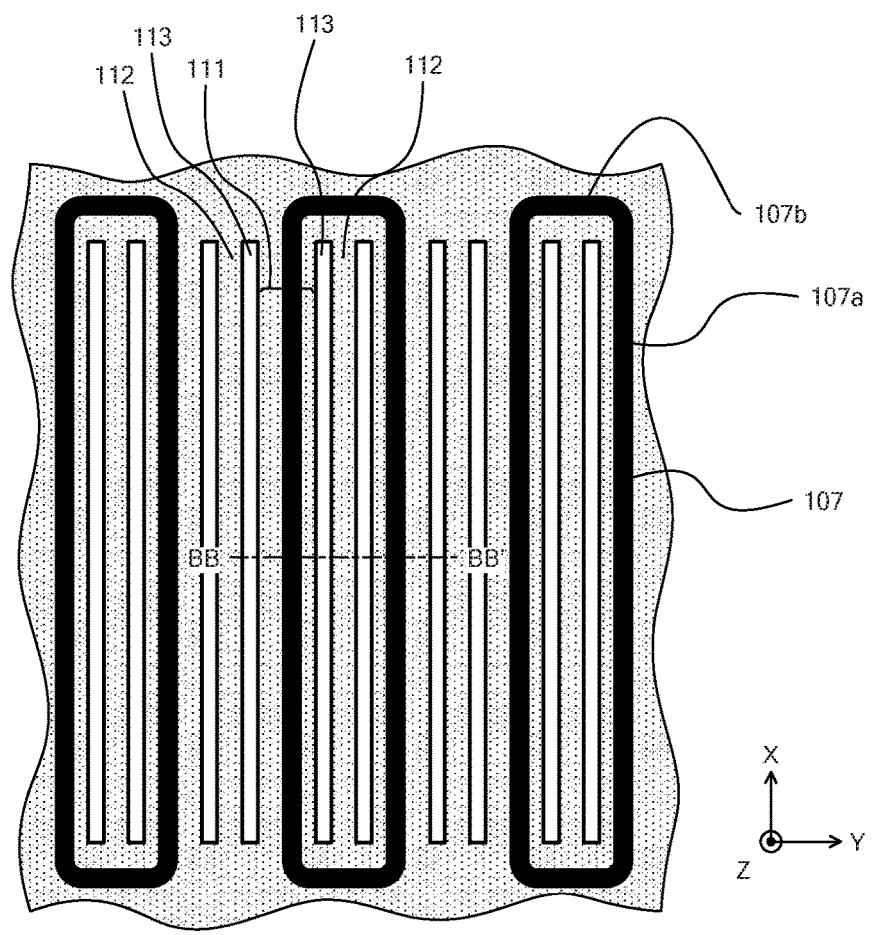

A JFET region 13a of the first mesa portion 31 is a region between adjacent first and second p$^+$-type regions 11, 12. A JFET region 13b of the second mesa portion 32 is a region between adjacent first p$^+$-type regions 11. In other words, the cell structure of the present invention, as compared to a conventional cell structure (refer to FIG. 20), is a structure in which in some of the mesa portions (the second mesa portions 32), the second p$^+$-type region and one JFET region are not present whereby the cell pitch (the width of one cell) w5 is smaller than that of the conventional structure. In particular, the cell pitch w5 is determined by the sum of a width w1 of the first p$^+$-type region 11, half of a width w2 of the second p$^+$-type region 12 of the first mesa portion 31, a width w3 of the JFET region 13a of the first mesa portion 31, and half of a width w4 of the JFET region 13b of the second mesa portion 32.

The minimum values of a width w6 and the widths w1 to w4 of the trench 7, the first and second p$^+$-type regions 11, 12, and the JFET regions 13a, 13b are determined by process limits (for example, process limits of etching) of the semiconductor manufacturing equipment. In particular, the minimum value of the width w6 of the trench 7 is about 0.7 µm to 0.8 µm. The first p$^+$-type region 11 is provided so as to cover the entire bottom of the trench 7 and thus, assuming deviation of the positioning of the first p$^+$-type region 11 along the second direction Y with respect to the trench 7, the minimum value of the width w1 of the first p$^+$-type region 11 is about 1.5 µm. The minimum value of the width w2 of the second p$^+$-type region 12 is about 1.0 µm. FIG. 1 depicts the second p$^+$-type region 12 for one cell (i.e., half of second p$^+$-type region 12). The minimum value of the widths w3, w4 of the JFET region 13a, 13b is about 1.0 µm. Provided the width w4 of the JFET region 13b of the second mesa portion 32 is ensured to be about 1.0 µm, the function of the adjacent first p$^+$-type regions 11 sandwiching the second mesa portion 32 is achieved.

From the dimensions above, the minimum value of the cell pitch w5 of the cell structure including the second p$^+$-type region 12 (i.e., the cell structure constituted by adjacent first and second mesa portions 31, 32) is 3.5 µm (=1.5 µm+(1.0 µm×½)+1.0 µm+(1.0 µm×½)), about 1.0 µm less than that of the conventional structure (the cell pitch w104=4.5 µm). As a result, the element area (the chip area) overall may be reduced. Further, the cell pitch w5 of the cell structure including the second p$^+$-type region 12 may be about 4 µm or less. In this case, for example, the width w2 of the second p$^+$-type region 12 may be increased by the difference from the minimum value of the cell pitch w5 (4.0 µm−3.5 µm=0.5 µm). The following effects are obtained in this case.

The greater the width w2 of the second p$^+$-type region 12 is, the greater the width of a contact hole for contact of a source electrode (first electrode) 16 and a semiconductor portion (the silicon carbide base 10) may be. Further, the greater the width w2 of the second p$^+$-type region 12 is, the larger the ensured safety margin is when patterning deviation is assumed such as for an ion implantation mask for forming the p$^{++}$-type contact region 6, and an etching mask for forming the contact hole for a contact of the source electrode 16 and the semiconductor portion. Therefore, contact of the source electrode 16 and the semiconductor portion is facilitated, enabling the defect rate of the contact of the source electrode 16 and the semiconductor portion to be decreased.

At a surface region (surface layer) of the base front surface of the p-type silicon carbide layer 22 that becomes the p-type base region 4, the n$^+$-type source region 5 and the p$^{++}$-type contact region 6 are each selectively provided. The n$^+$-type source region 5 faces the gate electrode 9 across a portion of the gate insulating film 8 along the sidewall of the trench 7. Further, the n$^+$-type source region 5 is also provided in the first and second mesa portions 31, 32. The p$^{++}$-type contact region 6 is provided in the first mesa portion 31 and, for example, faces the second p$^+$-type region 12 in a depth direction. The depth of the p$^{++}$-type contact region 6, for example, is deeper than that of the n$^+$-type source region 5.

The p$^{++}$-type contact region 6 contacts the n$^+$-type source region 5 of the first mesa portion 31. Further, a p$^{++}$-type contact region contacting the n$^+$-type source region 5 in the second mesa portion 32 is provided near the end portions of the adjacent trenches 7 sandwiching the second mesa portion 32 (reference characters 6b and 6c in FIGS. 9 to 12 described below). Contact of the source electrode 16 with these p$^{++}$-type contact regions fixes the n$^+$-type source regions 5 of the first and second mesa portions 31, 32 at the same potential (source potential). A portion of the p-type silicon carbide layer 22 excluding the n$^+$-type source region 5 and the p$^{++}$-type contact region 6 is the p-type base region 4.

The trench 7 penetrates the n$^+$-type source region 5 and the p-type base region 4 from the base front surface and reaches the n-type CSL region 3. In the trench 7, the gate insulating film 8 is provided along the sidewall of the trench 7. The gate electrode 9 is provided on the gate insulating film 8 so as to be embedded in the trench 7. A source-side terminal of the gate electrode 9 is at a high position substantially the same as that of the base front surface. The gate electrode 9, at a non-depicted portion (for example, the end portion of the gate electrode 9), is electrically connected to a gate pad (not depicted), via a gate runner (not depicted) that becomes a lead portion of the gate electrode 9.

An interlayer insulating film 14 is provided from the gate electrode 9, across the second mesa portion 32 so as to cover the entire region of the second mesa portion 32 and the gate electrode 9. A contact hole 14a is provided to penetrate the interlayer insulating film 14 in the depth direction and reach the first mesa portion 31 so that through the contact hole 14a, the source electrode 16 is in contact with the n$^+$-type source region 5 and the p$^{++}$-type contact region 6 of the first mesa portion 31 and is electrically insulated from the gate electrode 9 by the interlayer insulating film 14. Further, the source electrode 16 is electrically connected to the n$^+$-type source region 5 of the second mesa portion 32 at a non-depicted portion.

The source electrode 16 may be provided so as to cover a barrier metal 15 or may be provided only in the contact hole 14a. Between the source electrode 16 and the interlayer insulating film 14, for example, the barrier metal 15, which prevents diffusion of metal atoms from the source electrode 16 to the gate electrode 9 side, may be provided. On the source electrode 16, a source pad 17 is provided so as to be embedded in the contact hole 14a. On a rear surface of the silicon carbide base 10 (rear surface of an n$^+$-type silicon carbide substrate 1 that becomes an n$^+$-type drain region), a drain electrode (second electrode) 18 is provided.

Figure 2:
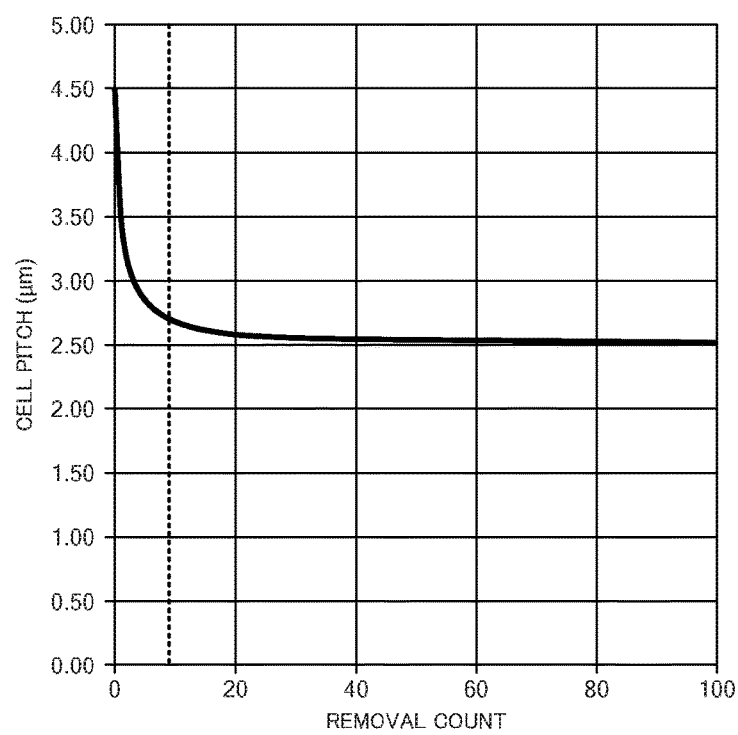
FIG. 2 is a characteristics diagram of a removal count of a second $p^+$-type region.

A suitable removal count of the second p$^+$-type region 12 will be described. FIG. 2 is a characteristics diagram of the removal count of the second p$^+$-type region. As depicted in FIG. 2, the higher the removal count of the second p$^+$-type region 12 is, the smaller the cell pitch w5 may be whereby the element area may be reduced. When the removal count of the second p$^+$-type region 12 is 2 or more, the cell structure including the second p$^+$-type region 12 and the cell structure not including the second p$^+$-type region 12 (i.e., a cell constituted by adjacent second mesa portions 32) are both present. The cell pitch w5 of the cell structure including the second p$^+$-type region 12 is as described above (refer to FIG. 1). A minimum value of a cell pitch w5' of the cell structure not including the second p$^+$-type region 12 (i.e., a cell constituted by adjacent second mesa portions 32), for example, is 2.5 µm (refer to FIG. 15 described below).

A range of about 1 or more to 30 or less for the removal count of the second p$^+$-type region 12 is the limit at which an effect (reduction of ON resistance) obtained by reducing the cell pitch w5 is obtained. Therefore, the removal count of the second p$^+$-type region 12 may be 30 or less. Further, the removal count of the second p$^+$-type region 12 may be an odd number. The reason for this is that plural adjacent cells of the same structure may be continuously arranged. A suitable removal count of the second p$^+$-type region 12 may be 1, 3, and at most 9 or less (left side of the dotted vertical line). The reason for this is that effect of the cell pitch reduction with respect to the removal count is large.

A method of manufacturing a silicon carbide semiconductor device according to the first embodiment will be described. FIGS. 3A, 3B, 4A, 4B, 5A, 5B, 6A, 6B, 7A, 7B, and 8 are cross-sectional views of the silicon carbide semiconductor device according to the first embodiment during manufacture. FIGS. 3A, 4A, 5A, 6A, and 7A depict a cross-sectional view of the active region 41; FIGS. 3B, 4B, 5B, 6B, and 7B depict an edge termination region 42. The active region 41 is a region in which current flows during the ON state (region responsible for current driving). The edge termination region 42 is a region that mitigates electric field on the base front surface of the n$^-$-type drift region 2 and ensures the breakdown voltage.

First, the n$^+$-type silicon carbide substrate 1 that becomes the n$^+$-type drain region is prepared. Next, on the front surface of the n$^+$-type silicon carbide substrate 1, the n$^-$-type silicon carbide layer 21a that becomes the n$^-$-type drift region 2 is formed by epitaxial growth. Next, in the surface layer of the n$^-$-type silicon carbide layer 21a, the first p$^+$-type region 11 and a p$^+$-type region (hereinafter, p$^+$-type partial region) 12a are each selectively formed by photolithography and ion implantation of a p-type impurity. The p$^+$-type partial region 12a is a portion of the second p$^+$-type region 12.

Next, in the entire n$^-$-type silicon carbide layer 21, an n-type impurity is ion implanted, forming in the entire surface layer of the n$^-$-type silicon carbide layer 21, an n-type region (hereinafter, n-type partial region) 3a. The n-type partial region 3a is a portion of the n-type CSL region 3. At this time, the depth of the n-type partial region 3a is made deeper than that of the first p$^+$-type region 11, and the entire drain side (the n$^+$-type silicon carbide substrate 1 side) of the first p$^+$-type region 11 and of the p$^+$-type partial region 12a is covered by the n-type partial region 3a. A portion of the n$^-$-type silicon carbide layer 21a farther on the drain side than the n-type partial region 3a is becomes the n$^-$-type drift region 2.

The sequence in which the n-type partial region 3a, the first p$^+$-type region 11, and the p$^+$-type partial region 12a are formed may be changed. Ion implantation into the silicon carbide layer may be performed at room temperature (less than 200 degrees C.), or may be performed at a high temperature (about 200 degrees C. to 500 degrees C.). For example, when the ion implantation is performed at room temperature, a resist film is used as a mask and when the ion implantation is performed at a high temperature, an oxide film (SiO$_2$) is used as a mask (similarly for all ion implantations described hereinafter).

Next, on the n$^-$-type silicon carbide layer 21a, the n$^-$-type silicon carbide layer 21b is formed by epitaxial growth. The n$^-$-type silicon carbide layer 21a and the n$^-$-type silicon carbide layer 21b form the n$^-$-type silicon carbide layer 21 described above. Next, the p$^+$-type partial region 12b is selectively formed by photolithography and ion implantation of a p-type impurity, in a portion of the n$^-$-type silicon carbide layer 21b facing the p$^+$-type partial region 12a in the depth direction to a depth reaching the p$^+$-type partial region 12a. The width and impurity concentration of the p$^+$-type partial region 12b, for example, are substantially the same as those of the p$^+$-type partial region 12a.

The p$^+$-type partial regions 12a, 12b are coupled in the depth direction (vertical direction), forming the second p$^+$-type region 12. The second p$^+$-type region 12 is formed in the first mesa portion 31 and is not formed in the second mesa portion 32. Further, the second p$^+$-type region 12 (hereinafter, outermost p$^+$-type region 12') is also formed near the boundary of the active region 41 with the edge termination region 42 and at a subsequent process, is extended to be farther on the outer side (chip edge side) than a step 43 (refer to FIG. 3B) formed between the active region 41 and the edge termination region 42 is.

Next, in the entire n$^-$-type silicon carbide layer 21b, an n-type impurity is ion implanted, forming in the entire n$^-$-type silicon carbide layer 21b, an n-type partial region 3b to a depth reaching the n-type partial region 3a. The impurity concentration of the n-type partial region 3b may be substantially the same as that of the n-type partial region 3a. The n-type partial regions 3a, 3b are coupled in the depth direction, forming the n-type CSL region 3. At a subsequent process, the n-type CSL region 3 is extended to be farther on the outer side than the step 43 formed between the active region 41 and the edge termination region 42 is. The sequence in which the p$^+$-type partial region 12b and the n-type partial region 3b are formed may be interchanged.

Next, on the n$^-$-type silicon carbide layer 21, the p-type base region 4 that becomes the p-type silicon carbide layer 22 is formed by epitaxial growth. By the processes up to here, the silicon carbide base (semiconductor wafer) 10 in which the n$^-$-type silicon carbide layer 21 and the p-type silicon carbide layer 22 are sequentially deposited on the n$^+$-type silicon carbide substrate 1 is formed. Next, the p-type silicon carbide layer 22 is removed from the entire edge termination region 42 by photolithography and etching, exposing the n$^-$-type silicon carbide layer 21. At this time, the surface layer of the n$^-$-type silicon carbide layer 21 and the p-type silicon carbide layer 22 may be slightly removed.

As a result, the step 43, at which the edge termination region 42 is lower than the active region 41, is formed on the front surface of the silicon carbide base 10. At a connection portion (stair of the step 43) 43a between the base front surfaces (upper and lower) of the active region 41 and the edge termination region 42, the outermost p$^+$-type region 12' is exposed from the lower step side to the lower step surface (surface of the n$^-$-type silicon carbide layer 21). When the p-type silicon carbide layer 22 is removed from the entire edge termination region 42, the p-type silicon carbide layer 22 may be removed to an outer peripheral portion of the active region 41. The stair 43a of the step 43 may be sloped with respect to the base front surface.

Next, a process in which photolithography and ion implantation are performed as one set is repeatedly performed whereby in the surface layer of the front surface of the silicon carbide base 10, the n$^+$-type source region 5, the p$^{++}$-type contact region 6, a junction termination (junction termination extension (JTE) structure and an n-type channel stopper region 46, etc. are sequentially formed. The p$^{++}$-type contact region 6 that is outermost (hereinafter, outermost p$^{++}$-type contact region 6') is formed from the active region 41 to the edge termination region 42 and the end portion of the p$^{++}$-type contact region 6, for example, is extended to be farther on the outer side than the stair 43a of the step 43 is, so as to cover the outermost p$^+$-type region 12'.

The JTE structure is formed by plural adjacent p-type regions (herein, two, a p$^+$-type region 44 and a p-type region 45) arranged in a concentric shape surrounding the periphery of the active region 41, and having impurity concentrations that progressively decrease the farther outward the p-type region is arranged. The p$^+$-type region 44 is formed so as to contact the outermost p$^{++}$-type contact region 6' on the innermost side (the active region 41 side) of the edge termination region 42. The p-type region 45 is formed farther on the outer side than the p$^+$-type region 44 is and is formed so as to contact the p$^+$-type region 44. The n-type channel stopper region 46 is formed separate from the p-type region 45, farther on the outer side than the p-type region 45 is. Activation annealing (heat treatment) of the regions formed by ion implantation is performed.

Figure 3A:
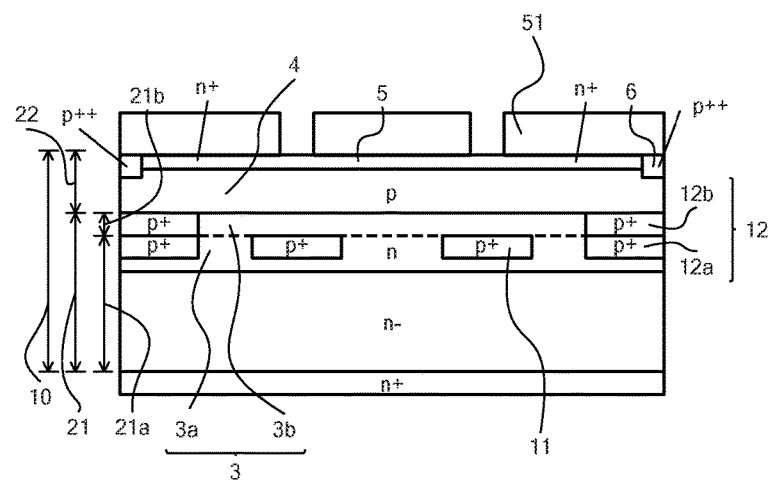
FIGS. 3A, 3B, 4A, 4B, 5A, 5B, 6A, 6B, 7A, 7B, and 8 are cross-sectional views of the silicon carbide semiconductor device according to the first embodiment during manufacture.
Figure 3B:
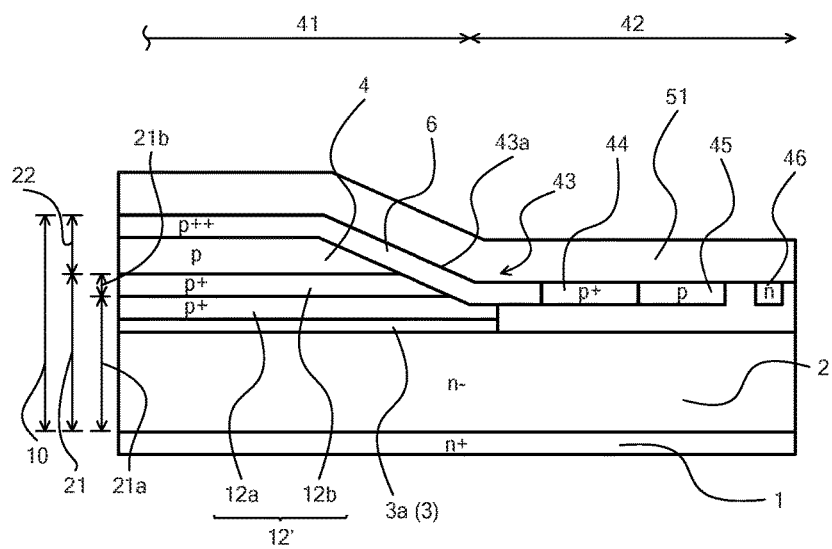

Next, for example, on the base front surface, an oxide film 51 is deposited by a chemical vapor deposition method at a normal pressure (for example, about 700 hPa to 1300 hPa, which is consequent to the installed gas flowrate). The thickness of the oxide film 51, for example, may be about 0.7 μm. Next, the oxide film 51 is patterned by photolithography and etching, exposing a portion corresponding to a formation region of the trench 7. The etching, for example, may be over etching (OE) of 25% more than a predetermined etching amount (=the thickness of the oxide film 51) by dry etching. The state up to here is depicted in FIGS. 3A and 3B.

Figure 4A:
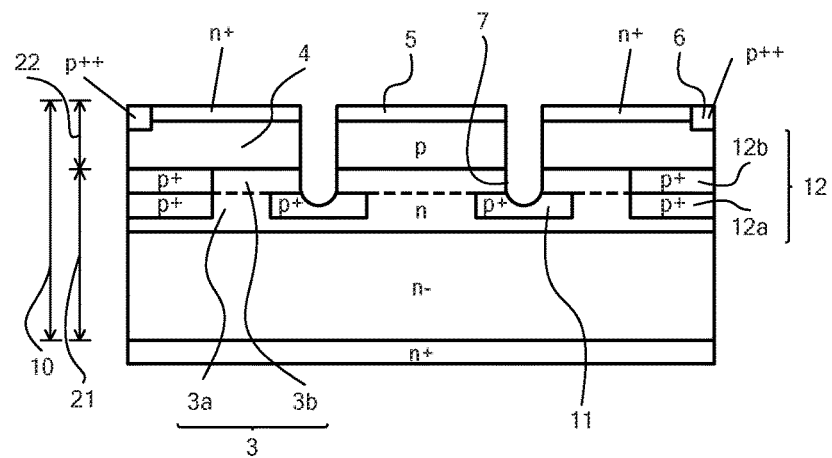
Figure 4B:
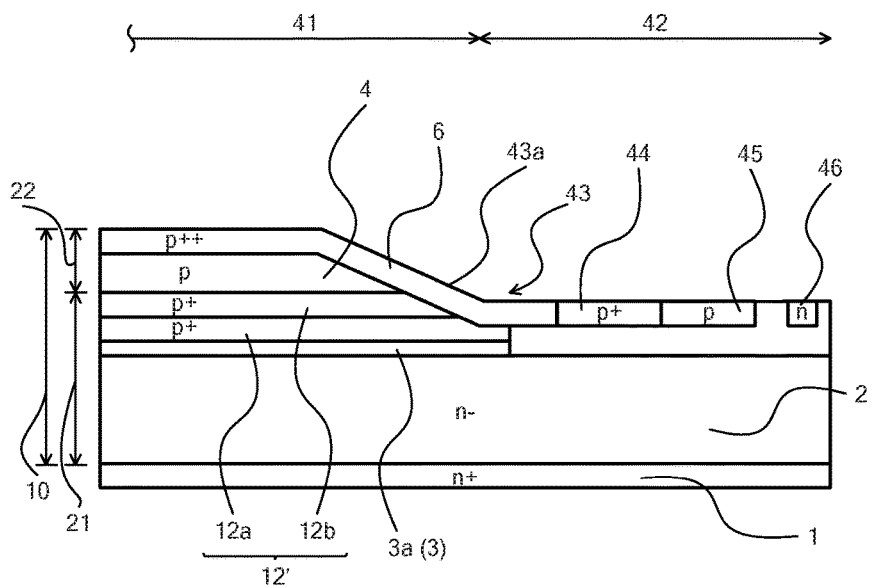

Next, the remaining portion of the oxide film 51 is used as a mask and etching is performed, forming the trench 7 so as to penetrate the n$^+$-type source region 5 and the p-type base region 4, and reach the first p$^+$-type region 11 in the n-type CSL region 3. The depth of the trench 7, for example, may be about 1.5 μm. Further, the sidewall of the trench 7 may be sloped with respect to the base front surface. For example, the sidewall of the trench 7 may be sloped at about 85 degrees with respect to the base front surface, making the upper side of the trench 7 wider than the bottom side. The oxide film 51 is removed. After the etching for forming the trench 7, annealing for rounding corner portions of the opening of the trench 7 and the bottom of the trench 7 is performed. Next, for example, sacrificial oxidation of the inner wall of the trench 7 is performed by dry oxidation and the surface layer of the inner wall of the trench 7 is removed by a thickness of about, for example, 10 nm. The state up to here is depicted in FIGS. 4A and 4B.

Figure 5A:
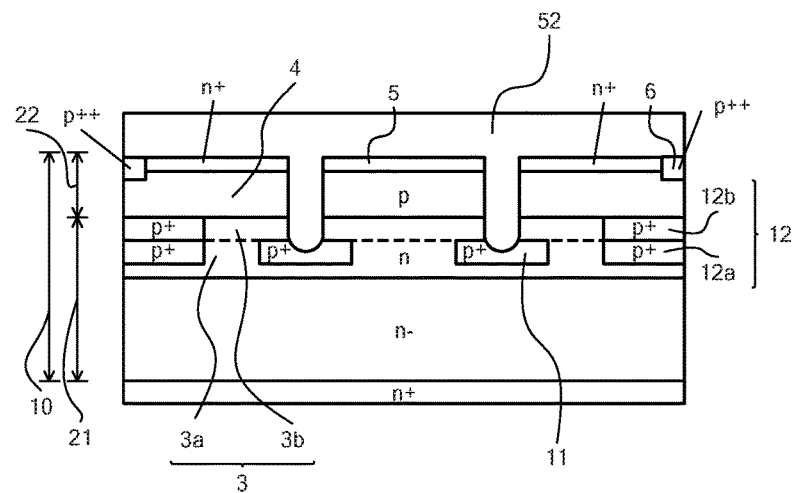
Figure 5B:
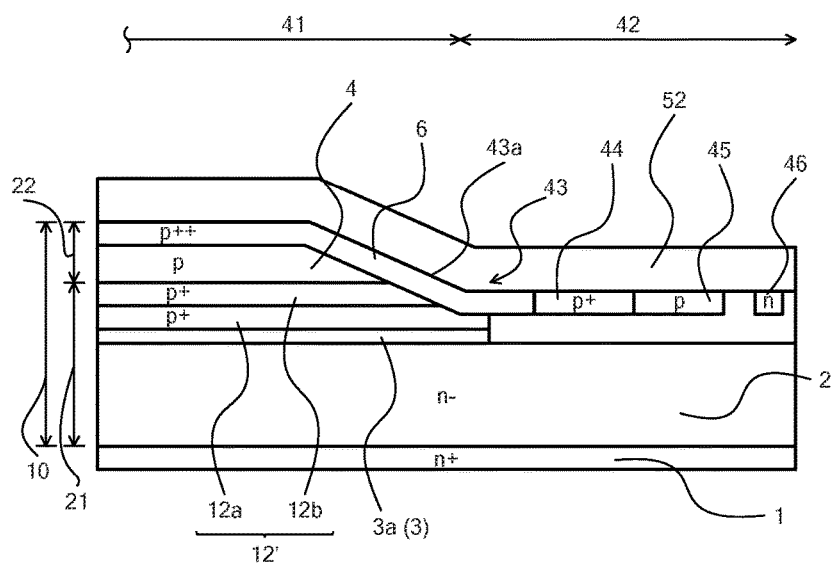

Next, for example, a thermal oxide film having a thickness of about 10 nm, for example, is formed by dry oxidation along the front surface of the silicon carbide base 10 (the surface of the p-type silicon carbide layer 22) and the inner wall of the trench 7. Next, for example, a deposition oxide film having a thickness of about 500 nm, for example, is deposited (formed) on the thermal oxide film by a CVD method at a normal pressure so as to be embedded in the trench. The thermal oxide film and the deposition oxide film are sequentially stacked, forming a field oxide film 52. Next, for example, heat treatment is performed in a nitrogen (N$_2$) atmosphere at about 1000 degrees C. for 30 minutes, enhancing the film quality (for example, densification) of the field oxide film 52. The state up to here is depicted in FIGS. 5A and 5B.

Next, the field oxide film 52 is patterned by photolithography and etching (for example, wet etching) to expose the inner wall of the trench 7 and the base front surface (portion where the MOS gate is formed) in the active region 41. Next, for example, by dry oxidation, the inner wall of the trench 7 and the exposed portion of the base front surface are subject to sacrificial oxidation and the surface layer of the base front surface and the inner wall of the trench 7 are removed by a thickness of about 10 nm, for example. Next, the inner wall of the trench 7 and the exposed portion of the base front surface are subject to thermal oxidation, forming along the inner wall of the trench 7 and the base front surface, for example, a high-temperature oxide (HTO) film 53 that becomes the gate insulating film 8.

Figure 6A:
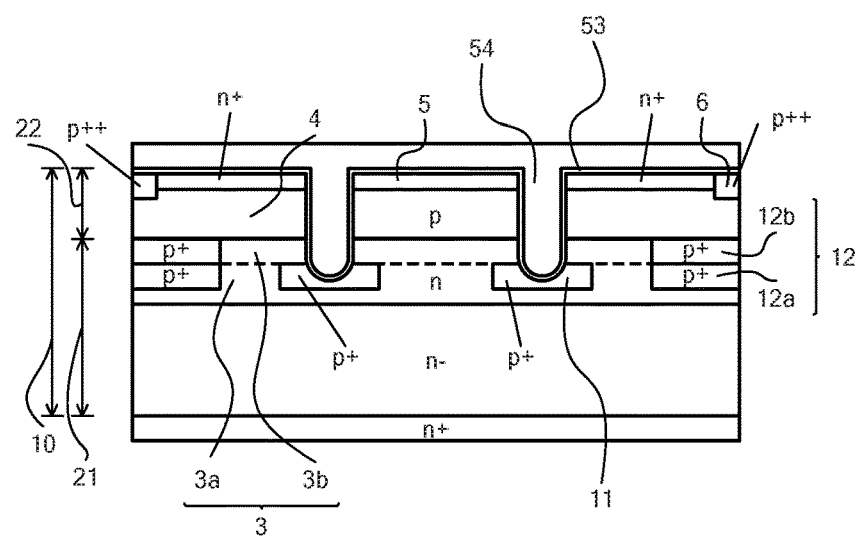
Figure 6B:
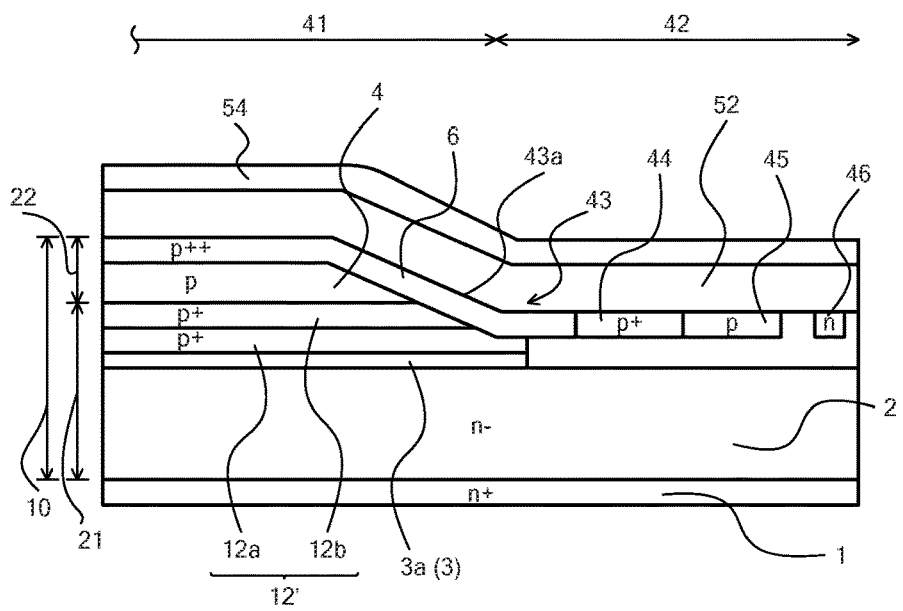

The thickness of the HTO film 53 at the sidewall of the trench 7 may be about 90 nm, for example. After formation of the HTO film 53, annealing for enhancing the film quality of the HTO film 53 (for example, densification) may be performed. Next, a doped poly-silicon (poly-Si) layer 54 doped with, for example, an n-type impurity is deposited on the surface of the HTO film 53 and the field oxide film 52 so as to be embedded in the trench 7. The thickness of the doped poly-silicon layer 54 may be about 500 nm, for example. Next, the amount of damage in the doped poly-silicon layer 54 is increased (non-crystalline quality is enhanced) by ion implantation of argon (Ar). The state up to here is depicted in FIGS. 6A and 6B.

Figure 7A:
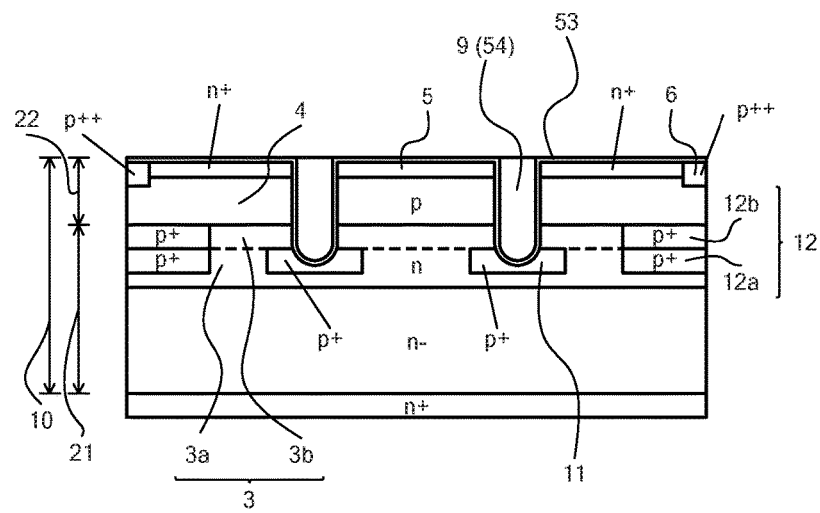

Next, on the surface of the doped poly-silicon layer 54, a resist mask 55 covering a portion corresponding to a formation region of a gate runner 19 is formed by photolithography. Next, the doped poly-silicon layer 54 is etched using the resist mask 55 as a mask whereby portions of the doped poly-silicon layer 54 becoming the gate electrode 9 and the gate runner 19 are left. In particular, the doped poly-silicon layer 54 is etched (i.e., etched back) until the gate insulating film 8 is exposed, leaving the doped poly-silicon layer 54 that becomes the gate electrode 9 in the trench 7. The height position of the top surface of the gate electrode 9 is a position at the same height as that of base front surface or lower (FIG. 7A).

Figure 7B:
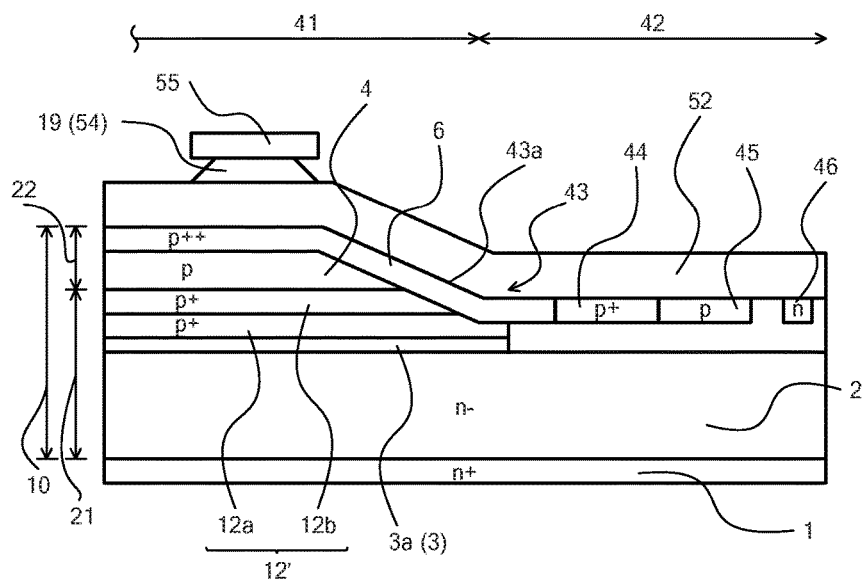
Figure 8:
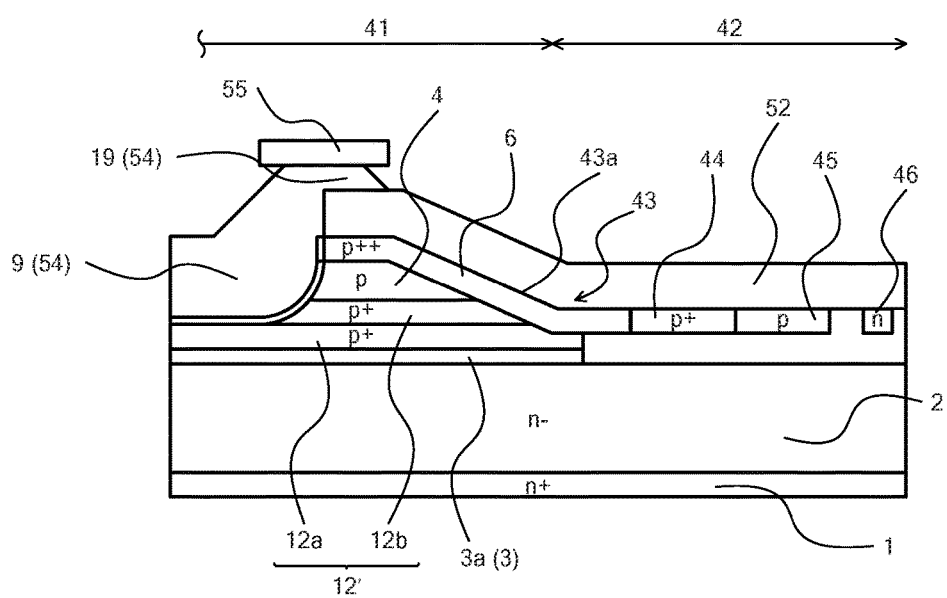

Additionally, near the boundary of the active region 41 and the edge termination region 42, the portion of the doped poly-silicon layer 54 covered by the resist mask 55 is left as the gate runner 19 (FIG. 7B). The gate electrode 9 and the gate runner 19 are connected near the boundary of the active region 41 and the edge termination region 42 (FIG. 8). This etching, for example, may be chemical dry etching (CDE). In this manner, since no resist mask is used in forming the gate electrode 9, there is no need to secure a safety margin for resist mask patterning deviations, enabling the cell pitch w5 to be reduced by an amount equivalent to this safety margin. The state up to here is depicted in FIGS. 7A, 7B, and 8.

Next, the interlayer insulating film 14 is formed on the entire base front surface so as to cover the gate electrode 9. Next, the interlayer insulating film 14 and the gate insulating film 8 are patterned and the contact hole is formed, exposing the $n^+$-type source region 5 and the $p^{++}$-type contact region 6. Next, the barrier metal 15 is formed and patterned so as to cover the interlayer insulating film 14 and again expose the $n^+$-type source region 5 and the $p^{++}$-type contact region 6. Next, the source electrode 16 is formed so as to contact the $n^+$-type source region 5 and the $p^{++}$-type contact region 6. The source electrode 16 may be formed so as to cover the barrier metal 15, and may be left in contact hole.

Next, the source pad 17 is formed so as to be embedded in the contact hole. A portion of a metal layer deposited for forming the source pad 17 may be used as a gate pad. The gate pad may be formed so as to contact the gate runner 19. On the rear surface of the $n^+$-type silicon carbide substrate 1, a drain electrode 18 is formed. Thereafter, the semiconductor wafer is cut (diced) into individual chips whereby the trench gate SiC-MOSFET depicted in FIG. 1 is completed.

As described above, according to the first embodiment, the first $p^+$-type region covering the bottom of the trench is arranged and the second $p^+$-type region contacting the p-type base region of a mesa portion, directly beneath the p-type base region (the drain side) is arranged, thereby enabling a predetermined breakdown voltage to be ensured. Further, the second $p^+$-type region is arranged so that two or more trenches are arranged between adjacent second $p^+$-type regions. Additionally, in a mesa portion (second mesa portion) in which no second $p^+$-type region is arranged, no $p^{++}$-type contact region or contact hole is arranged. As a result, the cell pitch may be reduced by an amount equivalent to not arranging either the second $p^+$-type region or the contact hole, enabling the ON resistance (RonA) to be reduced. Further, the mesa portion in which no second $p^+$-type region is arranged is arranged at a predetermined interval whereby the ON resistance of the entire element (the entire chip) may be reduced substantially uniformly. Therefore, while maintaining the predetermined breakdown voltage obtained by arranging the first and second $p^+$-type regions, the ON resistance may be reduced. Further, according to the first embodiment, the p-type base region and the $n^+$-type source region of the mesa portion in which no second $p^+$-type region is arranged, for example, are electrically connected to a source electrode near the end portion of the trench and the potential of the source electrode is fixed. Thus, even when the second $p^+$-type region is selectively arranged, the breakdown voltage may be prevented from decreasing in the mesa portion in which no second $p^+$-type region is arranged.

Figure 9:
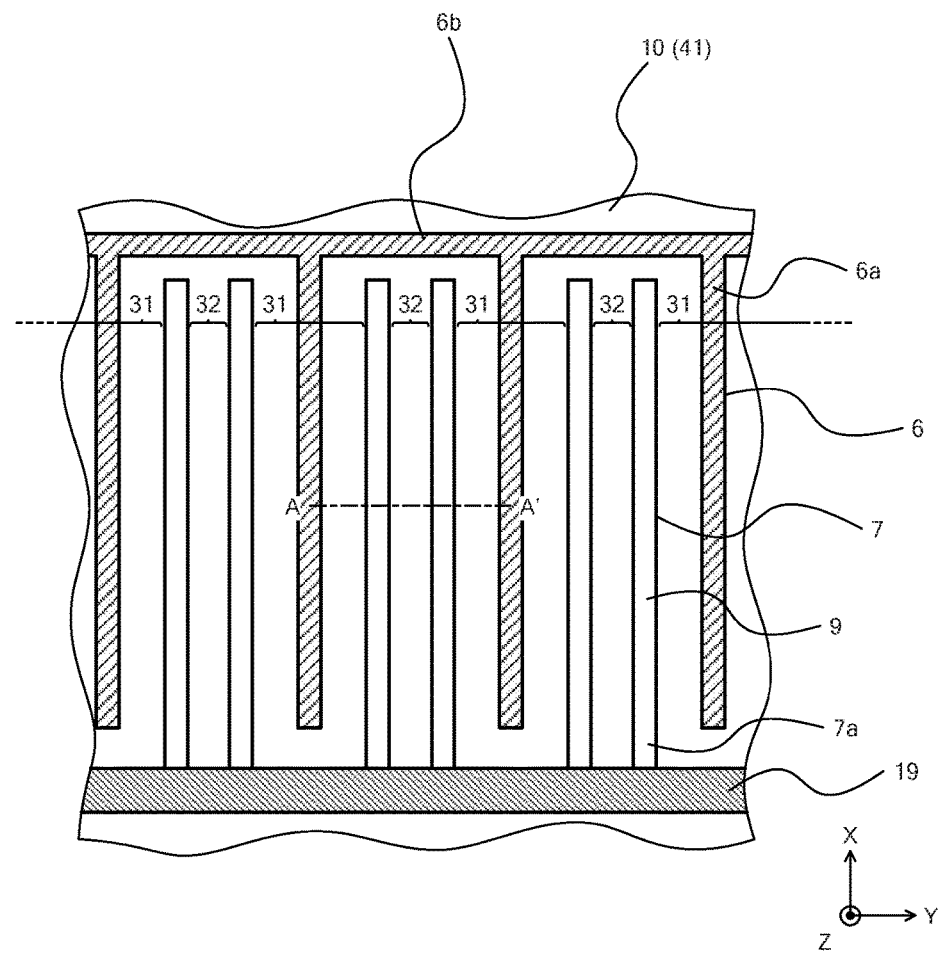
FIG. 9 is a plan view of a planar layout of the silicon carbide semiconductor device according to a second embodiment.

In a second embodiment, a planar layout of the silicon carbide semiconductor device according to the first embodiment (refer to FIG. 1) will be described. FIG. 9 is a plan view of a planar layout of the silicon carbide semiconductor device according to the second embodiment. The planar layout is a planar shape and arrangement configuration of constituent parts as viewed from the front surface of the silicon carbide base 10 side. FIG. 9 depicts a planar layout of the trench 7 and the $p^{++}$-type contact region 6 in the active region 41, regions provided at the surface layer of the base front surface and the gate insulating film 8 are not depicted (similarly in FIGS. 10 to 12).

A planar layout in a case in which the removal count of the second $p^+$-type region 12 is one is depicted in FIG. 9. In other words, a cross-section at cutting line A-A' in FIG. 9 corresponds to FIG. 1. The trench 7 is arranged in a striped planar layout extending in a predetermined direction (hereinafter, first direction) X. One end portion 7a of the length dimension of all of the trenches 7 is connected to the gate runner 19. The gate runner 19, for example, is arranged in a linear planar layout extending in a direction (hereinafter, second direction) Y orthogonal to the first direction X.

In the first and second mesa portions 31, 32 (between trenches 7), a non-depicted p-type base region and an $n^+$-type source region (not depicted) are provided. The $p^{++}$-type contact region 6, in the first mesa portion 31, is arranged in a striped planar layout extending in the first direction X. One end portion 6a of the length dimension of all of the p'-type contact regions 6 is connected to a $p^{++}$-type contact region (hereinafter, connection portion (sixth semiconductor region)) 6b and arranged in a pectinate shaped planar layout.

The connection portion 6b of the $p^{++}$-type contact region 6, for example, at a position facing the gate runner 19 across the trench 7, is arranged in a linear shaped planar layout substantially parallel to the second direction Y. In other words, an electrical contact portion (source contact) contacting the source electrode (not depicted) is arranged in a pectinate shaped planar layout that is substantially the same as that of the $p^{++}$-type contact region 6 and the connection portion 6b thereof. The $n^+$-type source region (not depicted) of the second mesa portion 32 is connected to the connection portion 6b of the $p^{++}$-type contact region 6.

Figure 10:
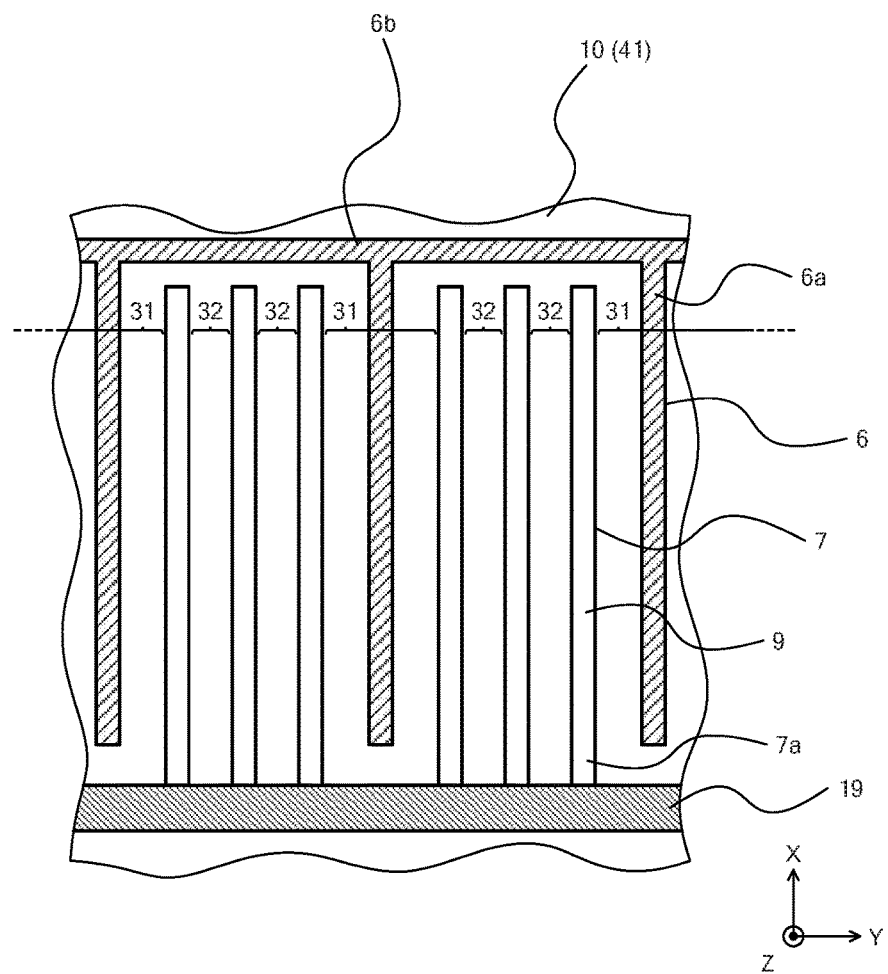
FIGS. 10, 11, and 12 are plan views of other examples of the planar layout of the silicon carbide semiconductor device according to the second embodiment.
Figure 11:
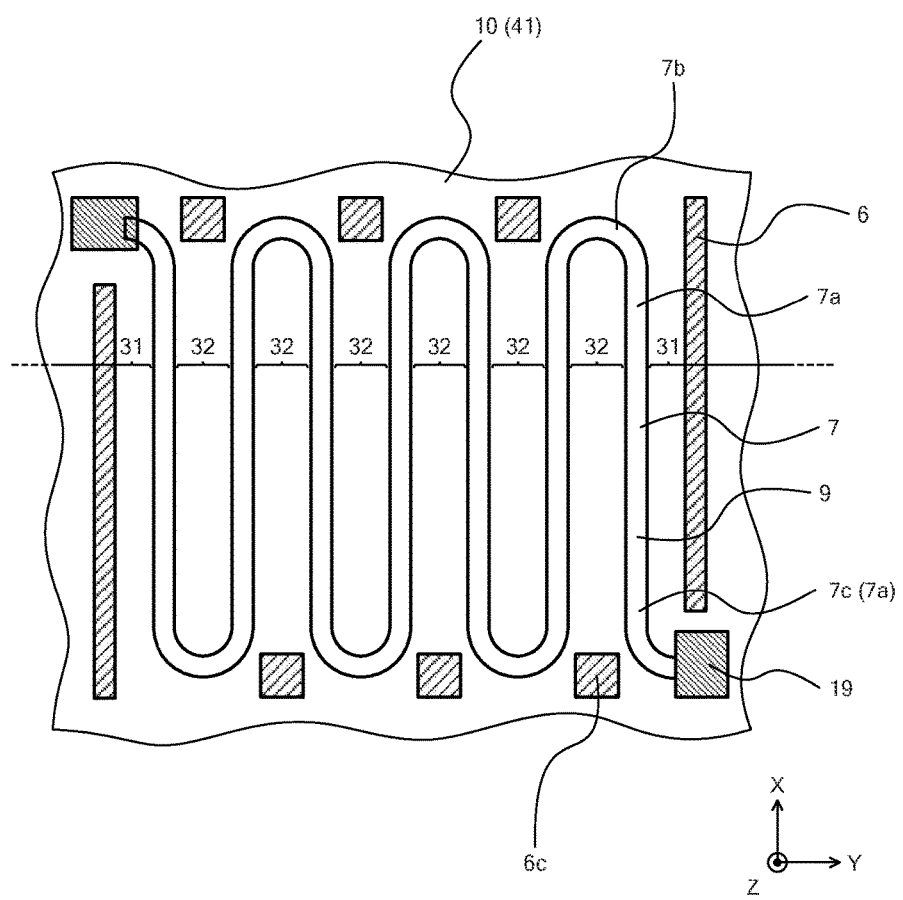
Figure 12:
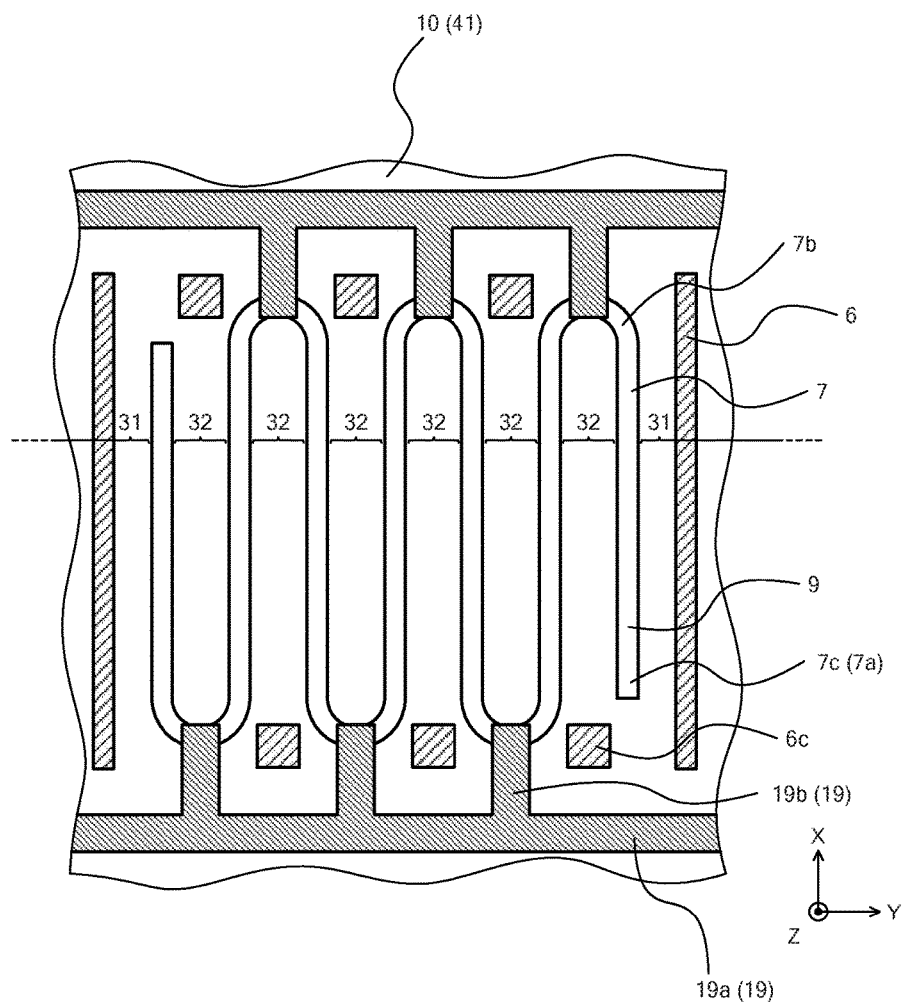

FIGS. 10, 11, and 12 are plan views of other examples of the planar layout of the silicon carbide semiconductor device according to the second embodiment. In a case in which the removal count of the second $p^+$-type region 12 is two, as depicted in FIG. 10, between adjacent first mesa portions 31, two of the second mesa portions 32 are arranged so as to be adjacent to each other along the second direction Y. Excluding the arrangement of the second mesa portion 32, the configuration of the silicon carbide semiconductor device according to the second embodiment depicted in FIG. 1 is the same as that of the silicon carbide semiconductor device according to the second embodiment depicted in FIG. 9.

Further, in a case in which the removal count of the second $p^+$-type region 12 is two or more, as depicted in FIGS. 11 and 12, the end portions 7a of the trenches 7 may be connected to arrange a single trench having a meandering planar layout. FIGS. 11 and 12 depict a case in which the removal count of the second $p^+$-type region 12 is six. Connected portions 7b of the trenches 7, for example, have an arced planar shape. The gate runner 19 may be connected to both end portions 7c of the single trench of the meandering planar layout (FIG. 11). In this case, the gate runner 19 having a substantially rectangular planar shape may be separately arranged near each of the end portions 7c of the single trench of the meandering planar layout.

Further, the gate runner 19 may be connected to each of the connected portions 7b of the trenches 7 (FIG. 12). In this case, the gate runner 19, for example, may be arranged in a pectinate shaped planar layout formed by a linear portion 19a of a linear shape extending along the second direction Y and plural connection portions 19b connected to the connected portions 7b of the trenches 7 and the linear portion 19a. The end portions 7c of the single trench of the meandering planar layout may each be connected to the linear portion 19a of the gate runner 19 by the connection portions 19b, or may extend on the gate runner 19 side to be connected to of the linear portion 19a of the gate runner 19.

The p$^{++}$-type contact region 6 of the first mesa portion 31 is arranged in a striped planar layout extending along the first direction X. A p$^{++}$-type contact region (hereinafter, partial p$^{++}$-type contact region (sixth semiconductor region) 6c is selectively arranged separately from the p$^{++}$-type contact region 6 of the first mesa portion 31, at a position facing the second mesa portion 32 along the first direction X and between the connected portions 7b of adjacent trenches 7 along the second direction Y. The partial p$^{++}$-type contact region 6c is connected to the source electrode (not depicted) and the n$^+$-type source region (not depicted) of the second mesa portion 32. The source contact is arranged in a planar layout that is substantially the same as that of the p$^{++}$-type contact region 6 and the partial p$^{++}$-type contact region 6c.

As described above, according the second embodiment, application to the first embodiment is possible and effects identical to those of the first embodiment may be obtained.

Figure 13:
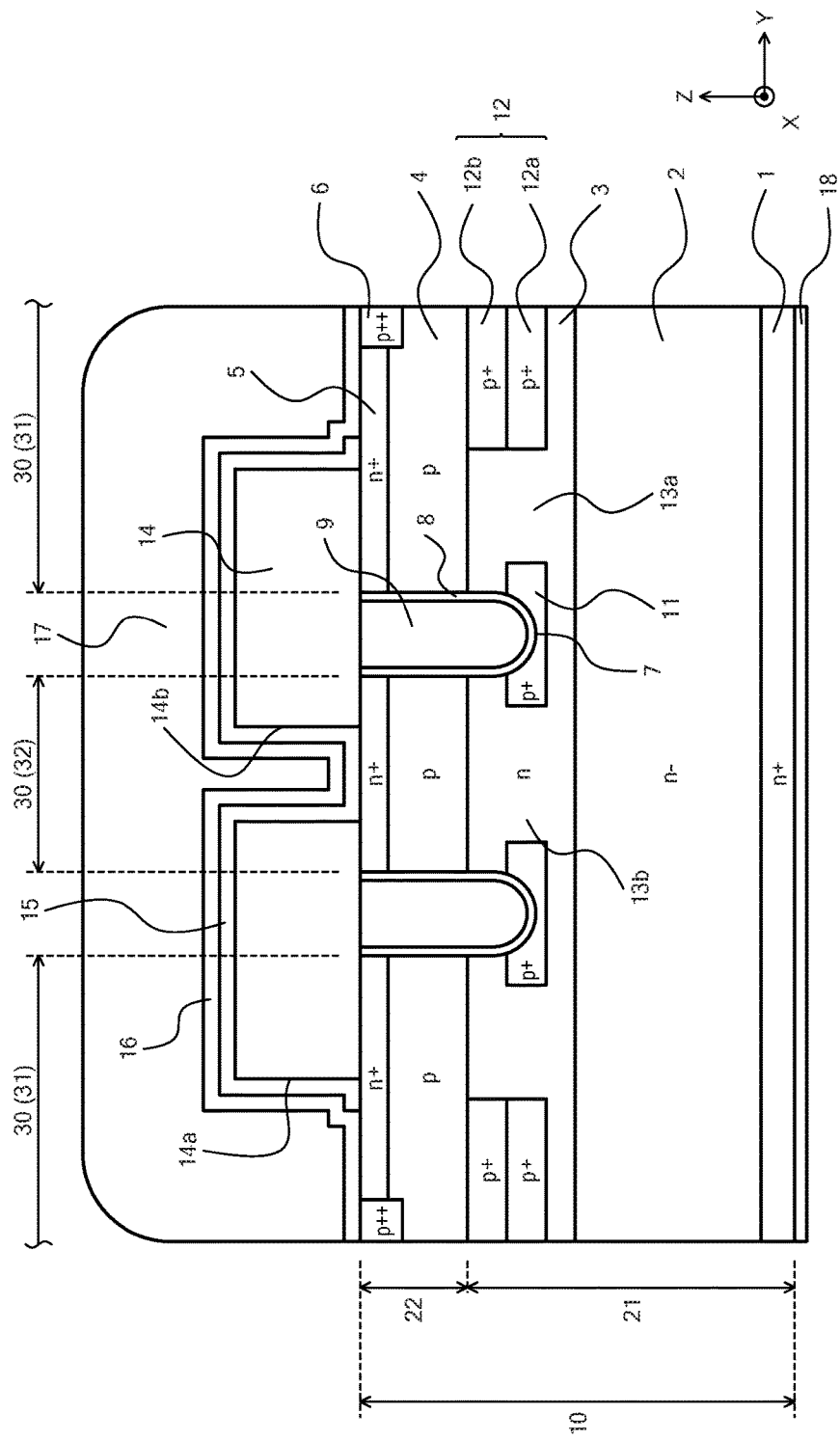
FIG. 13 is a cross-sectional view of the structure of the silicon carbide semiconductor device according to a third embodiment.
Figure 14:
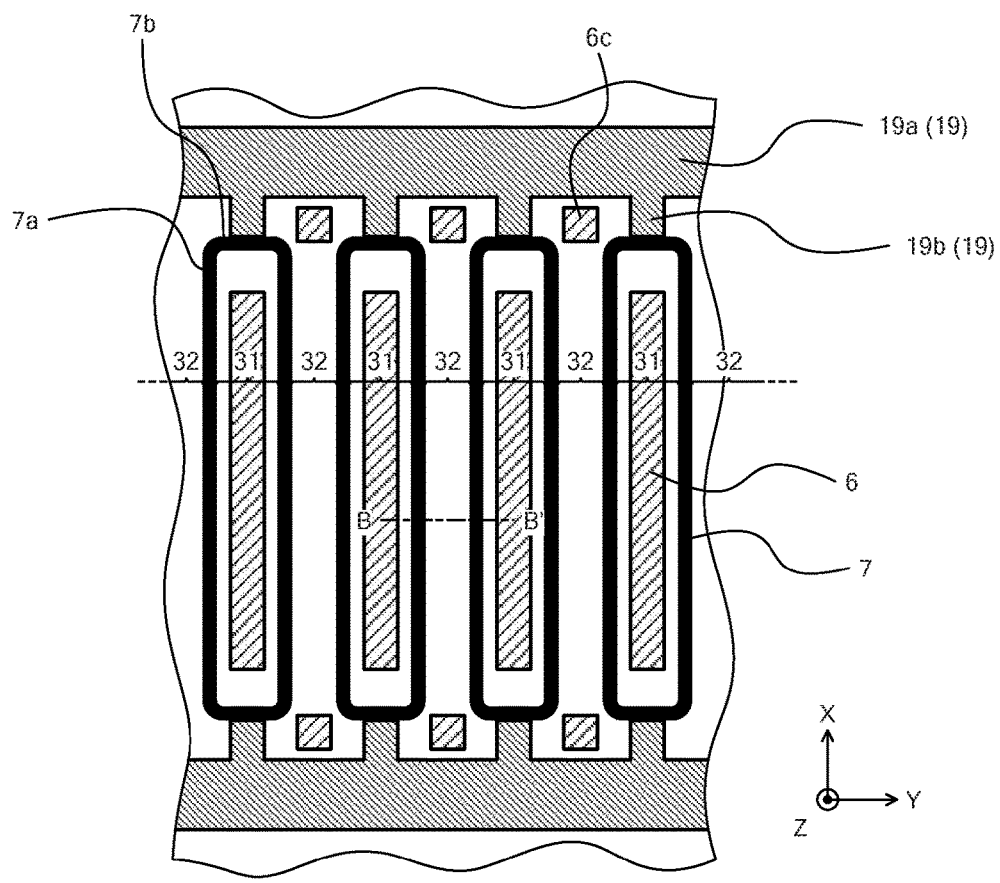
FIG. 14 is a plan view of a planar layout of the silicon carbide semiconductor device according to the third embodiment.

A structure of the silicon carbide semiconductor device according to a third embodiment will be described. FIG. 13 is a cross-sectional view of the structure of the silicon carbide semiconductor device according to the third embodiment. FIG. 13 is a cross-sectional view along cutting line B-B' in FIG. 14. FIG. 14 is a plan view of a planar layout of the silicon carbide semiconductor device according to the third embodiment. In FIG. 14, the trench 7 is depicted filled-in with black (similarly in FIGS. 16 to 18). The silicon carbide semiconductor device according to the third embodiment differs from the silicon carbide semiconductor device according to the first embodiment in that the source electrode 16 contacts the n$^+$-type source region 5 of the second mesa portion 32.

In particular, as depicted in FIG. 13, a contact hole (hereinafter, first contact hole) 14a penetrating the interlayer insulating film 14 in the depth direction is added in the first mesa portion 31 and a second contact hole 14b penetrating the interlayer insulating film 14 in the depth direction is provided in the second mesa portion 32. The source electrode 16 is connected to the n$^+$-type source region 5 and the p$^{++}$-type contact region 6 of the first mesa portion 31 through the first contact hole 14a, and is connected to the n$^+$-type source region 5 of the second mesa portion 32 through the second contact hole 14b.

In this case, as depicted in FIG. 14, for example, two adjacent trenches 7 are connected at the end portions 7a by the connected portion 7b and form a substantially ring shaped planar layout surrounding the periphery of the first mesa portion 31. The gate runner 19 is arranged at each of the end portions 7a of the trenches 7. The gate runners 19, for example, are arranged in a pectinate shaped planar layout formed by the linear portion 19a of a linear shape extending along the second direction Y and the connection portions 19b each connecting the connected portions 7b of the trenches 7 and the linear portion 19a.

The n$^+$-type source region (not depicted) and the p'-type contact region 6 of the first mesa portion 31 are arranged in a striped planar layout extending along the first direction X. The n$^+$-type source region (not depicted) and the p$^{++}$-type contact region 6 of the first mesa portion 31 are arranged inside the ring shaped planar layout of the trench 7. The partial p$^{++}$-type contact region 6c is selectively arranged separately from the p$^{++}$-type contact region 6 of the first mesa portion 31, at a position facing the second mesa portion 32 along the first direction X and between the connected portions 7b of adjacent trenches 7 along the second direction Y.

As described above, according to the third embodiment, effects identical to those of the first embodiment may be obtained. Further, according to the third embodiment, the n$^+$-type source region of the second mesa portion may be directly connected to the source electrode and fixed at the source potential.

Figure 15:
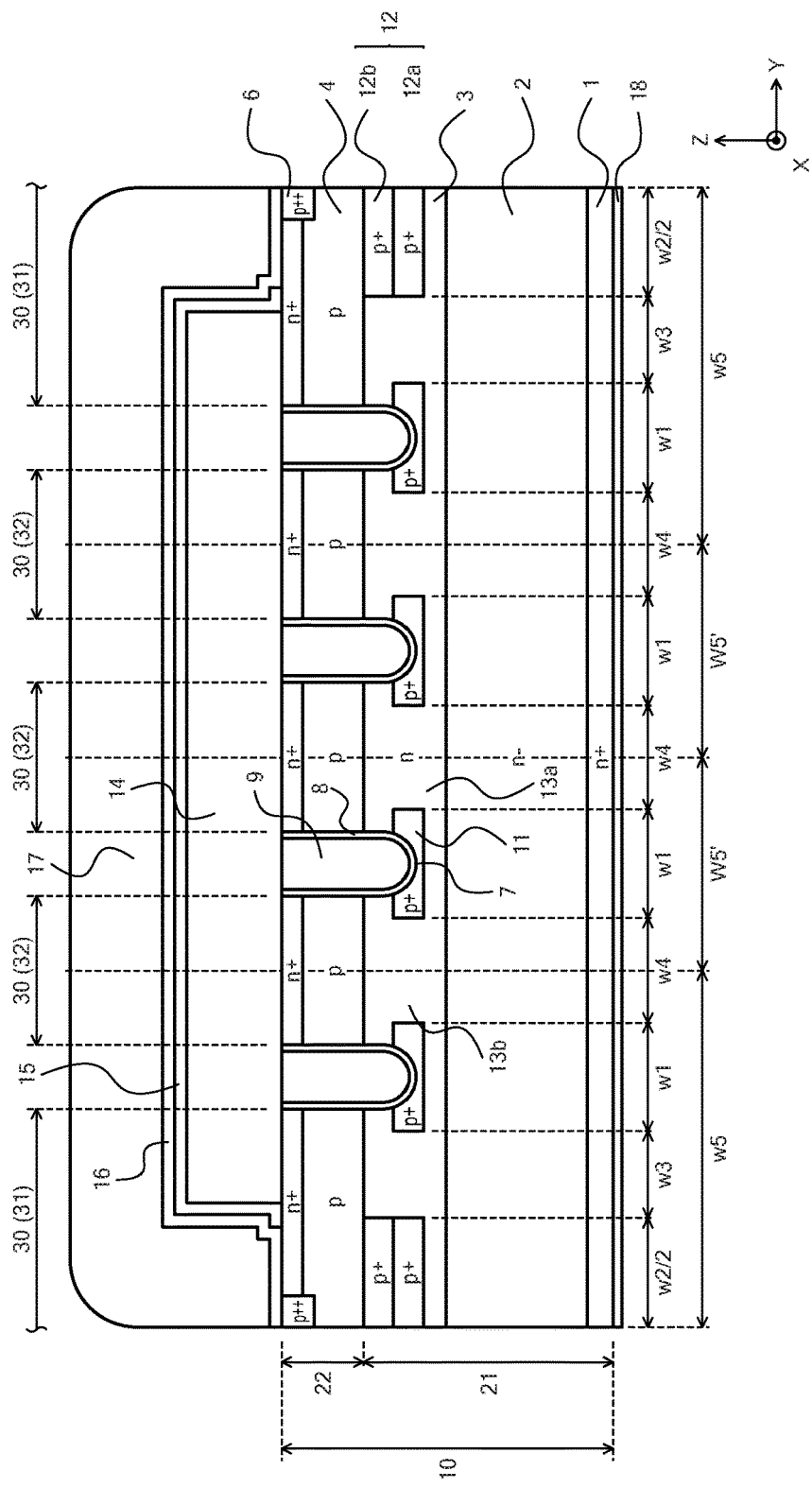
FIG. 15 is a cross-sectional view of the structure of the silicon carbide semiconductor device according to a fourth embodiment.
Figure 16:
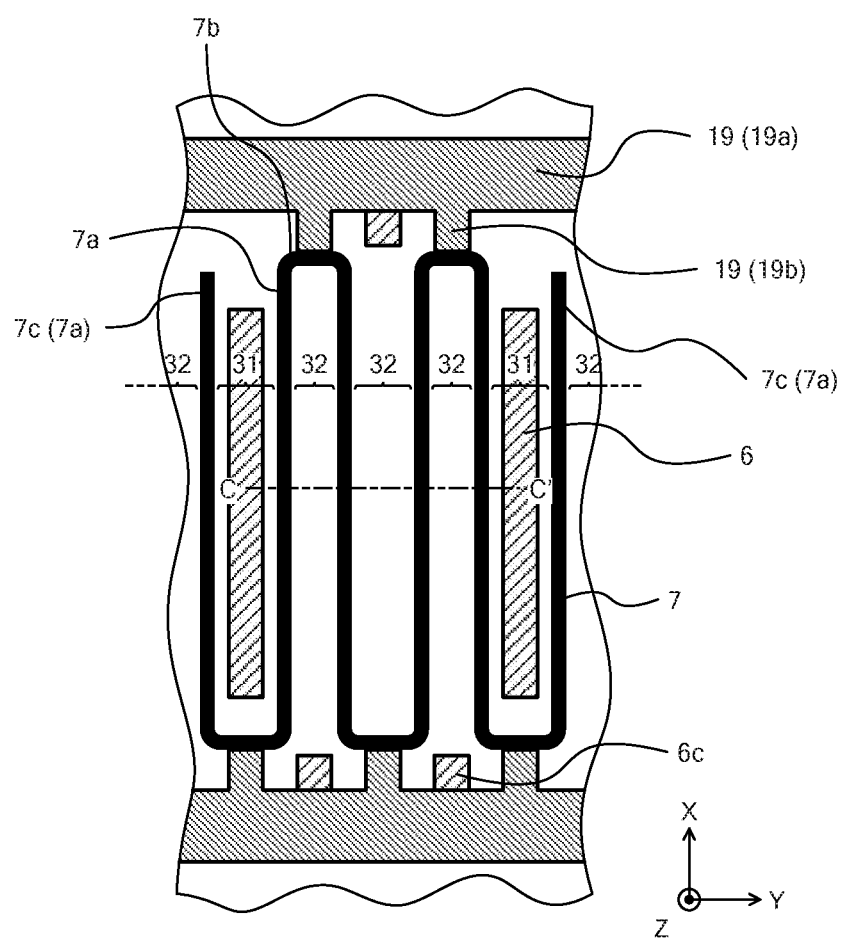
FIG. 16 is a plan view of a planar layout of the silicon carbide semiconductor device according to the fourth embodiment.

A structure of the silicon carbide semiconductor device according to a fourth embodiment will be described. FIG. 15 is a cross-sectional view of the structure of the silicon carbide semiconductor device according to the fourth embodiment. FIG. 15 is a cross-sectional view along cutting line C-C' in FIG. 16. FIG. 16 is a plan view of a planar layout of the silicon carbide semiconductor device according to the fourth embodiment. The silicon carbide semiconductor device according to the fourth embodiment is a trench gate SiC-MOSFET in a case where in the first embodiment, the removal count of the second p$^+$-type region 12 is three.

In other words, three adjacent second mesa portions 32 along the second direction Y are arranged between adjacent first mesa portions 31. The three adjacent second mesa portions 32 along the second direction Y arranged between the adjacent first mesa portions 31 are covered by the interlayer insulating film 14. The cell pitch w5' of a cell structure in which no second p$^+$-type region 12 is included is the sum of the width w1 of the first p$^+$-type region 1 and half of the width w4 of the JFET region 13b of the second mesa portion 32×2; and the minimum value thereof is 2.5 μm (=1.5 μm+(1.0 μm×½)×2).

The planar layouts of the trench 7, the p$^{++}$-type contact region 6, the partial p$^{++}$-type contact region 6c, and the gate runner 19 may be the same as those in FIGS. 11, 12 of the second embodiment. In other words, the end portions 7a of the trenches 7 may be connected to arrange a single trench having a meandering planar layout. Further, as depicted in FIG. 16, the trenches 7 may have a planar layout in which the end portions 7a of adjacent trenches 7 sandwiching the first mesa portion 31 are connected and extend so as to meander and surround the p$^{++}$-type contact region 6.

As described above, according to the fourth embodiment, effects identical to those of the first to third embodiments may be obtained. Further, according to the fourth embodiment, setting the removal count of the second p$^+$-type region 12 to three or more enables a cell structure to be arranged in which no second p$^+$-type region 12 is included whereby the cell pitch may be further decreased. Thus, the overall ON resistance of the element and the element area (the chip area) may be reduced.

Figure 17:
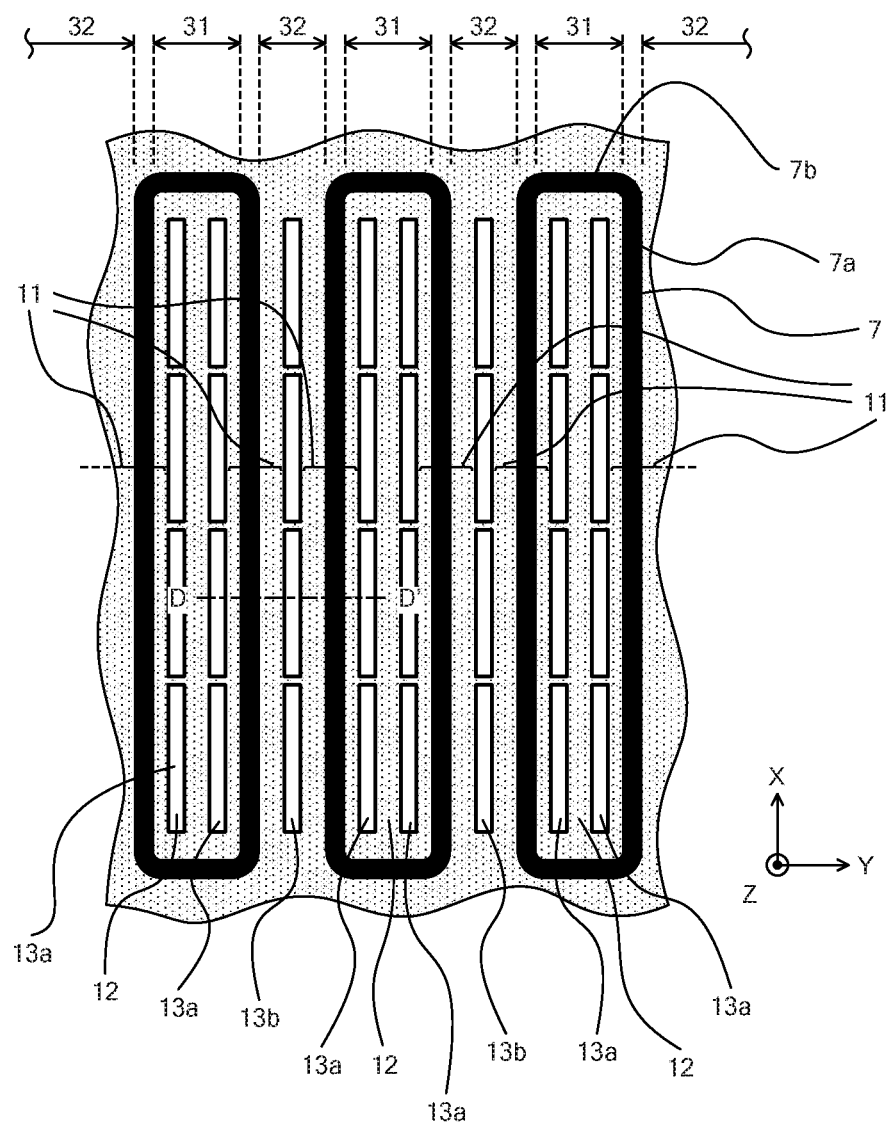
FIG. 17 is a plan view of a planar layout of the silicon carbide semiconductor device according to a fifth embodiment.
Figure 18:
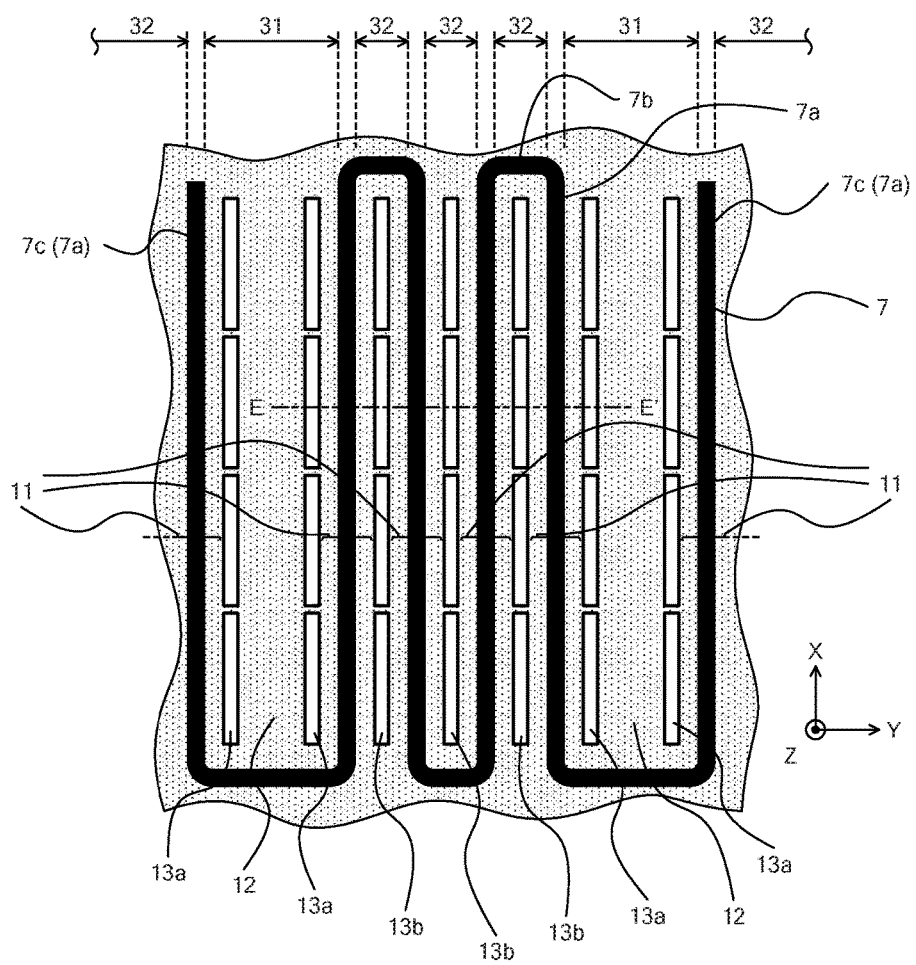
FIG. 18 is a plan view of another example of the planar layout of the silicon carbide semiconductor device according to the fifth embodiment.

A structure of the silicon carbide semiconductor device according to a fifth embodiment will be described. FIG. 17 is a plan view of a planar layout of the silicon carbide semiconductor device according to the fifth embodiment. FIG. 18 is a plan view of another example of the planar layout of the silicon carbide semiconductor device according to the fifth embodiment. The cross-section at cutting line D-D' in FIG. 17 corresponds to that in FIG. 13 of the third embodiment. The cross-section at cutting line E-E' in FIG. 18 corresponds to that in FIG. 15 of the fourth embodiment. In FIGS. 17 and 18, a planar layout of the first and second p$^+$-type regions 11, 12 (hatched portion) and the JFET regions 13a, 13b (fill-in white portions) are depicted.

The silicon carbide semiconductor device according to the fifth embodiment differs from the silicon carbide semiconductor device according to the third and fourth embodiments in that adjacent first and second p$^+$-type regions 11, 12 as well as adjacent first p$^+$-type regions 11 are partially connected at predetermined intervals, respectively separating the JFET regions 13a, 13b. In other words, the JFET regions 13a, 13b are arranged in plural at predetermined intervals along the second direction Y so that the JFET regions (the JFET regions 13a, 13b) are arranged in a matrix shaped planar layout. The JFET regions, for example, have a linear shape extending along the second direction Y.

As described above, according to the fifth embodiment, effects identical to those of the first to fourth embodiments may be obtained. Further, according to the fifth embodiment, adjacent first and second p$^+$-type regions as well as adjacent first p$^+$-type regions are partially connected a predetermined intervals, enabling the potential of the p$^+$-type region to be fixed and decreases in breakdown voltage consequent to floating potential to be prevented.

Figure 19:
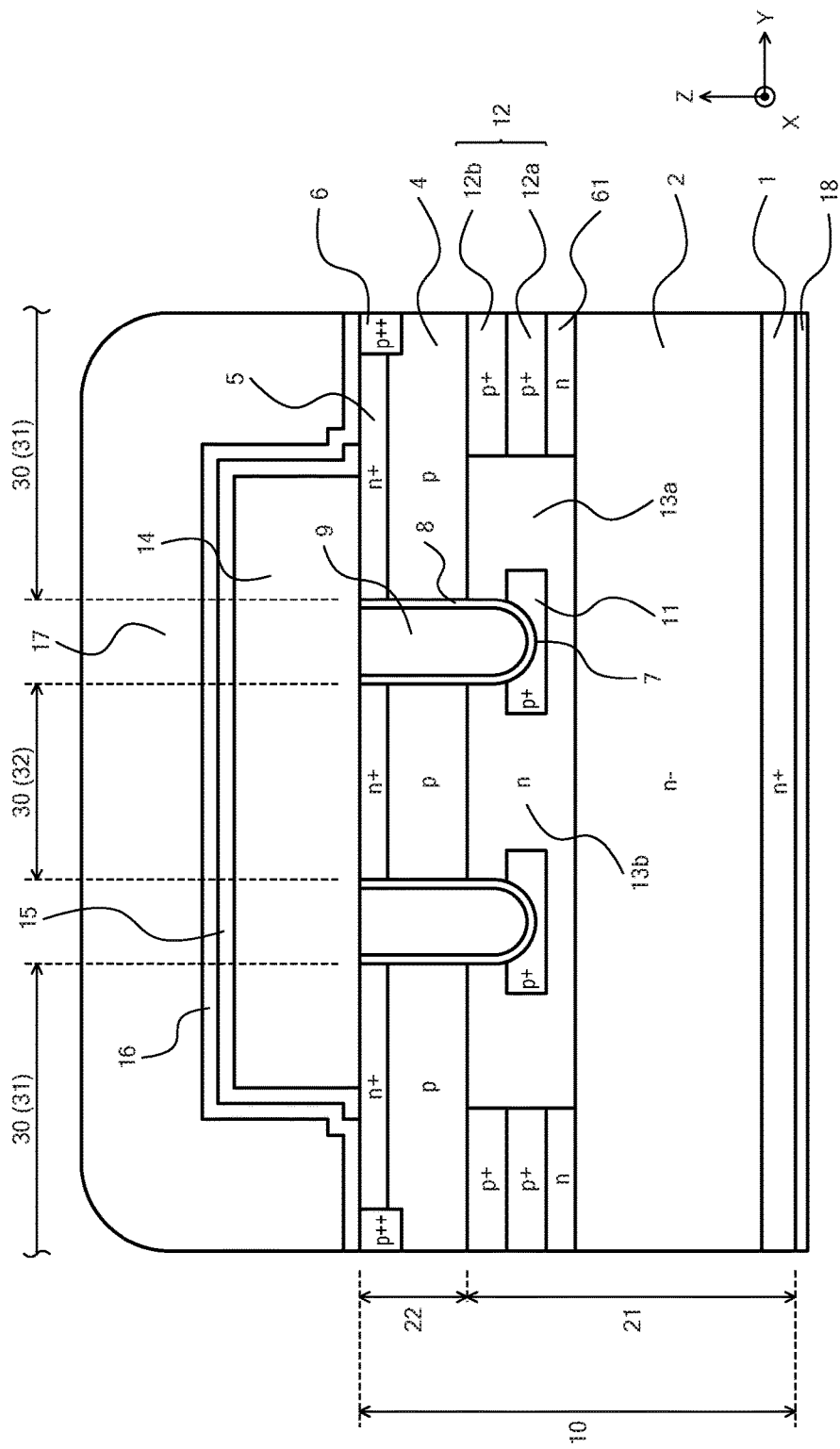
FIG. 19 is a cross-sectional view of the structure of the silicon carbide semiconductor device according to a sixth embodiment.

A structure of the silicon carbide semiconductor device according to a sixth embodiment will be described. FIG. 19 is a cross-sectional view of the structure of the silicon carbide semiconductor device according to the sixth embodiment. The silicon carbide semiconductor device according to the sixth embodiment differs from the silicon carbide semiconductor device according to the first embodiment in that in the n-type CSL region 3, directly beneath the second p$^+$-type region 12 (on the drain side), an n-type CSL region (hereinafter, partial n-type CSL region) 61 is selectively provided in contact with the second p$^+$-type region 12. The partial n-type CSL region 61 has an impurity concentration that is higher than the n-type CSL region 3. The width of the partial n-type CSL region 61, for example, may be the same as the width w2 of the second p$^+$-type region 12.

As described above, according to the sixth embodiment, effects identical to those of the first to fifth embodiments may be obtained. Further, according to the sixth embodiment, the partial n-type CSL region is provided directly beneath the second p$^+$-type region, enabling the breakdown voltage near the second pt type region to be lower than that near the first p$^+$-type region. As a result, the occurrence of avalanche breakdown near the second p$^+$-type region may be facilitated as compared to near the first p$^+$-type region, enabling the occurrence of avalanche breakdown at the trench bottom to be avoided.

In the present invention above, various modifications not deviating from the spirit of the invention are possible and in the embodiments described above, for example, the dimensions and impurity concentrations of the constituent parts, the removal count of the second p$^+$-type region, and the like may be variously set according to required specifications. Further, arrangement of the trench constituting the MOS gate of the trench gate structure may be variously changed, the active region may be divided into plural sections and in the sections, the trenches may be arranged in respective predetermined planar layouts.

In the embodiments described above, although a MOSFET has been described as an example, without limitation hereto, wide application is possible with respect to other silicon carbide semiconductor devices of a trench gate structure. For example, an insulated gate bipolar transistor (IGBT) or the like may be given as an example of another silicon carbide semiconductor device of a trench gate structure. Further, the present invention is similarly implemented when the conductivity types (n-type, p-type) are reversed.

Although, in general, the smaller the cell pitch w104 is, the lower the ON resistance (RonA) can be made, in the conventional structures above (refer to FIG. 20), the cell pitch w104 cannot be made less than 4.5 μm consequent to process limitations of semiconductor manufacturing equipment. Thus, reduction of the ON resistance below the ON resistance that can be realized by the cell pitch w104 of 4.5 μm is impossible and the advantage of a trench gate structure in terms of being able to reduce (shrink) the element area as compared to a planar gate structure is not fully taken realized.

According to the present invention, the third semiconductor region covering the bottom of the trench is arranged and the fourth semiconductor region that contacts the first semiconductor region is arranged directly beneath the first semiconductor region (p-type base region) between trenches (first mesa portion) whereby a predetermined breakdown voltage may be secured and maintained. Additionally, according to the invention described above, the fourth semiconductor region is selectively arranged so that two or more trenches are between adjacent fourth semiconductor regions whereby the cell pitch may be reduced.

The silicon carbide semiconductor device and the method of manufacturing a silicon carbide semiconductor device according the present invention achieve an effect in that breakdown voltage may be maintained and ON resistance may be reduced.

As described, the silicon carbide semiconductor device and the method of manufacturing a silicon carbide semiconductor device according to the present invention are useful for power semiconductor devices used in power converting equipment and power supply devices such as in industrial machines, and are particularly suitable for silicon carbide semiconductor devices of a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
    a silicon carbide substrate of a first conductivity type, having a front surface and a rear surface;
    a plurality of trenches provided in the silicon carbide substrate each being of a predetermined depth from the front surface of the silicon carbide substrate;
    a first semiconductor region of a second conductivity type, provided between each adjacent two of the plurality of trenches;
    a second semiconductor region of the first conductivity type, selectively provided in the first semiconductor region;
    a plurality of third semiconductor regions of the second conductivity type, selectively provided in the silicon carbide substrate to each cover a bottom of one of the plurality of trenches;
    a plurality of fourth semiconductor regions of the second conductivity type, selectively provided in the silicon carbide substrate, each fourth semiconductor region being formed between adjacent two of the plurality of trenches and being in contact with the first semiconductor region;
    a plurality of gate electrodes, each provided, via a gate insulating film, in one of the plurality of trenches;
    a first electrode connected to the first semiconductor region and the second semiconductor region; and
    a second electrode connected to the rear surface of the silicon carbide substrate, wherein
    at least two of the plurality of trenches are arranged between each adjacent two of the fourth semiconductor regions,
    the second semiconductor regions are formed in a first surface of the first semiconductor regions, and the fourth semiconductor regions contact with a second surface of the first semiconductor regions, the second surface of the first semiconductor regions being opposite to the first surface of the first semiconductor regions.

2. The silicon carbide semiconductor device according to claim 1,
wherein each fourth semiconductor region and each third semiconductor region are separated from each other.

3. The silicon carbide semiconductor device according to claim 1,
wherein each fourth semiconductor region is partially connected to one of the third semiconductor regions adjacent thereto.

4. The silicon carbide semiconductor device according to claim 3,
wherein said at least two trenches include three or more of the plurality of trenches, and
each adjacent two of the third semiconductor regions are partially connected.

5. The silicon carbide semiconductor device according to claim 1,
wherein each of the plurality of trenches is of a stripe shape extending along a direction parallel to the front surface of the silicon carbide substrate.

6. The silicon carbide semiconductor device according to claim 5, further comprising:
a plurality of fifth semiconductor regions of the second conductivity type, selectively provided in first semiconductor region; and
a plurality of sixth semiconductor regions of the second conductivity type, selectively provided in the first semiconductor region,
wherein each fifth semiconductor region is arranged to face one of the fourth semiconductor regions in a depth direction,
each sixth semiconductor region is arranged near end portions of said at least two trenches between said each adjacent two of the fourth semiconductor regions, and
the first electrode is connected to the first semiconductor region through the fifth semiconductor regions and the sixth semiconductor regions.

7. The silicon carbide semiconductor device according to claim 1, further comprising a plurality of unit structures, each unit structure being an insulated gate structure including the gate electrode in one of the plurality of trenches, wherein
the plurality of unit structures are arranged at a predetermined pitch of 4 µm or less.

8. A silicon carbide semiconductor device, comprising:
a silicon carbide substrate of a first conductivity type, having a front surface and a rear surface;
a plurality of trenches provided in the silicon carbide substrate each being of a predetermined depth from the front surface of the silicon carbide substrate;
a first semiconductor region of a second conductivity type, provided between each adjacent two of the plurality of trenches;
a second semiconductor region of the first conductivity type, selectively provided in the first semiconductor region;
a plurality of third semiconductor regions of the second conductivity type, selectively provided in the silicon carbide substrate to each cover a bottom of one of the plurality of trenches;
a plurality of fourth semiconductor regions of the second conductivity type, selectively provided in the silicon carbide substrate, each fourth semiconductor region being formed between adjacent two of the plurality of trenches and being in contact with the first semiconductor region;
a plurality of gate electrodes, each provided, via a gate insulating film, in one of the plurality of trenches;
a first electrode connected to the first semiconductor region and the second semiconductor region; and
a second electrode connected to the rear surface of the silicon carbide substrate, wherein
each adjacent two of the fourth semiconductor regions face each other along a first direction,
in between each of the adjacent two of the fourth semiconductor regions are arranged at least two of the plurality of trenches in the first direction,
the second semiconductor regions are formed in a first surface of the first semiconductor regions, and
the fourth semiconductor regions contact with a second surface of the first semiconductor regions, the second surface of the first semiconductor regions being opposite to the first surface of the first semiconductor regions.

* * * * *